(12) United States Patent
Gupta

(10) Patent No.: US 9,407,240 B2
(45) Date of Patent: Aug. 2, 2016

(54) BI-QUAD CALIBRATION

(71) Applicant: Spero Devices, Inc., Acton, MA (US)

(72) Inventor: Dev V. Gupta, Concord, MA (US)

(73) Assignee: Spero Devices, Inc., Acton, MA (US)

( * ) Notice: Subject to any disclaimer, the term of this patent is extended or adjusted under 35 U.S.C. 154(b) by 284 days.

(21) Appl. No.: 14/017,850

(22) Filed: Sep. 4, 2013

(65) Prior Publication Data

US 2014/0306777 A1 Oct. 16, 2014

Related U.S. Application Data

(60) Provisional application No. 61/779,390, filed on Mar. 13, 2013, provisional application No. 61/697,049, filed on Sep. 5, 2012.

(51) Int. Cl.
*H03H 17/02* (2006.01)
*H03H 11/12* (2006.01)
*H03H 11/04* (2006.01)

(52) U.S. Cl.
CPC ....... *H03H 17/0294* (2013.01); *H03H 11/0433* (2013.01); *H03H 11/0472* (2013.01); *H03H 11/1252* (2013.01); *H03H 11/1291* (2013.01); *H03H 17/0248* (2013.01); *H03H 2210/01* (2013.01); *H03H 2210/012* (2013.01)

(58) Field of Classification Search
None
See application file for complete search history.

(56) References Cited

U.S. PATENT DOCUMENTS

| | | | |
|---|---|---|---|
| 3,434,060 A | 3/1969 | Painter et al. | |
| 3,550,116 A | 12/1970 | Kiyasu Zeniti et al. | |
| 3,978,416 A | 8/1976 | Sutphin, Jr. | |
| 4,086,539 A | 4/1978 | Gustafson et al. | |
| 4,179,665 A | 12/1979 | Gregorian | |
| 4,449,047 A * | 5/1984 | Monroe | 250/253 |
| 4,507,791 A | 3/1985 | Gundry | |
| 5,144,258 A | 9/1992 | Nakanishi et al. | |
| 5,157,346 A | 10/1992 | Powell et al. | |

(Continued)

FOREIGN PATENT DOCUMENTS

| | | |
|---|---|---|
| CN | 1172558 A | 2/1998 |
| CN | 1509534 A | 6/2004 |

(Continued)

OTHER PUBLICATIONS

P. Tobin, "Electric Circuits—Chapter 7—The Biquad Filter", course notes from Dublin Institute of Technology, May 2008, retrieved from https://web.archive.org/web/20041226012018/http://www.electronics.dit.ie/staff/ptobin/3chapt07.pdf.*

(Continued)

*Primary Examiner* — Matthew Sandifer
(74) *Attorney, Agent, or Firm* — Hamilton, Brook, Smith & Reynolds, P.C.

(57) ABSTRACT

Embodiments include methods of tuning state variable filters. Examples include state variable filters whose center frequencies can be tuned using variable gain blocks coupled to outputs of filter integrators. First- and second-order state variable filters may operate on signals in parallel and their outputs combined to produce a filtered output. Filters may be tuned to pass or reject signals depending on the application; sample applications include, but are not limited to: agile filtering; spectrum analysis; interference detection and rejection; equalization; direct intermediate-frequency transmission; and single-sideband modulation and demodulation.

9 Claims, 27 Drawing Sheets

(56) References Cited

U.S. PATENT DOCUMENTS

| | | | |
|---|---|---|---|
| 5,325,204 A | 6/1994 | Scarpa | |
| 5,574,678 A | 11/1996 | Gorecki | |
| 5,959,871 A | 9/1999 | Pierzchala et al. | |
| 6,060,935 A * | 5/2000 | Shulman | 327/345 |
| 6,118,794 A | 9/2000 | Cornfield et al. | |
| 6,307,427 B1 | 10/2001 | Yamazaki et al. | |
| 6,359,507 B1 | 3/2002 | Myer | |
| 6,384,761 B1 | 5/2002 | Melanson | |
| 6,424,209 B1 | 7/2002 | Gorecki et al. | |
| 6,593,812 B2 | 7/2003 | Sundström | |
| 6,677,876 B1 | 1/2004 | Hoggarth et al. | |
| 6,765,377 B1 | 7/2004 | Lu | |
| 6,774,719 B1 | 8/2004 | Wessel et al. | |
| 6,919,763 B2 | 7/2005 | Boscolo et al. | |
| 6,937,175 B1 | 8/2005 | Cruz-Albrecht et al. | |
| 7,158,591 B2 | 1/2007 | Harris | |
| 7,400,212 B1 * | 7/2008 | Vishinsky | 333/17.1 |
| 7,733,950 B2 | 6/2010 | Ko | |
| 8,126,949 B1 | 2/2012 | Scheuermann et al. | |
| 8,483,626 B2 | 7/2013 | Gupta | |
| 8,779,832 B2 | 7/2014 | Gupta | |
| 8,866,531 B2 | 10/2014 | Gupta et al. | |
| 8,913,652 B2 | 12/2014 | Gupta et al. | |
| 8,970,252 B2 | 3/2015 | Gupta | |
| 2001/0041957 A1 | 11/2001 | McCann et al. | |
| 2002/0114270 A1 | 8/2002 | Pierzga et al. | |
| 2002/0196876 A1 | 12/2002 | Takada | |
| 2003/0076907 A1 | 4/2003 | Harris | |
| 2003/0155922 A1 | 8/2003 | Royle et al. | |
| 2004/0021594 A1 | 2/2004 | Melanson | |
| 2004/0078403 A1 | 4/2004 | Scheuermann et al. | |
| 2004/0227572 A1 | 11/2004 | Takata et al. | |
| 2005/0038847 A1 | 2/2005 | Cheng et al. | |
| 2005/0052226 A1 | 3/2005 | Doerrer | |
| 2005/0077960 A1 | 4/2005 | Kim et al. | |
| 2005/0130609 A1 | 6/2005 | Nagode et al. | |
| 2005/0266805 A1 | 12/2005 | Jensen | |
| 2005/0275577 A1 | 12/2005 | Bjornsen | |
| 2006/0092057 A1 | 5/2006 | Slavin | |
| 2006/0158247 A1 | 7/2006 | Lee | |
| 2006/0186995 A1 | 8/2006 | Wu et al. | |
| 2006/0261846 A1 | 11/2006 | Twigg | |
| 2006/0284687 A1 | 12/2006 | Abel | |
| 2007/0146071 A1 | 6/2007 | Wu | |
| 2007/0286264 A1 | 12/2007 | Kontola et al. | |
| 2009/0184769 A1 | 7/2009 | Lee et al. | |
| 2010/0097152 A1 * | 4/2010 | Wang et al. | 331/44 |
| 2011/0051782 A1 * | 3/2011 | Gupta et al. | 375/140 |
| 2012/0075011 A1 * | 3/2012 | Bailey | G11B 20/10009 327/553 |
| 2012/0194265 A1 * | 8/2012 | Katsube et al. | 327/554 |
| 2012/0249093 A1 | 10/2012 | Grbo et al. | |
| 2013/0106487 A1 | 5/2013 | Gupta | |
| 2013/0293264 A1 | 11/2013 | Gupta | |
| 2013/0293308 A1 | 11/2013 | Gupta | |

FOREIGN PATENT DOCUMENTS

| | | |
|---|---|---|
| CN | 1771665 (A) | 5/2006 |
| CN | 101053160 A | 10/2007 |
| CN | 101404481 A | 4/2009 |
| EP | 0579875 A1 | 1/1994 |
| GB | 2296165 B | 12/1999 |
| GB | 2 439 116 A | 12/2007 |
| JP | 2007-058596 A | 3/1995 |
| JP | 2007-240664 A | 9/1995 |
| JP | 2008-122408 A | 5/2008 |
| JP | 2011-526428 | 10/2011 |
| TW | 379436 B | 8/1998 |
| WO | WO 02/095990 A1 | 11/2002 |
| WO | WO 2006-131565 A1 | 12/2006 |
| WO | WO 2009/114123 A2 | 9/2009 |
| WO | WO 2011/152896 A1 | 12/2011 |
| WO | WO 2012/061385 A1 | 5/2012 |
| WO | WO 2012/064551 A2 | 5/2012 |

OTHER PUBLICATIONS

Notification of Transmittal of The International Search Report and the Written Opinion of the International Searching Authority, or the Declaration for PCT/US2013/057996, "Bi-Quad Calibration", mailed Dec. 26, 2013.

Franco, Sergio, "State-Variable and Biquad Filters" (Jan. 1, 1988), In *Design With Operational Amplifiers and Analog Integrated Circuits*, (McGraw-Hill Book Company), pp. 136-145, XP009153311.

Notification Concerning Transmittal of International Preliminary Report on Patentability for Int'l Application No. PCT/US2009/001512, "Method, System, and Apparatus for Wideband Signal Processing," Date Mailed: Sep. 23, 2010.

S.P. et al, 'A Transmitter IC for TETRA Systems Based on Cartesian Feedback Loop Linearization Technique', In: IEEE Journal of Solid-State Circuits, vol. 40, No. 3, Mar. 2005, pp. 707-718.

C.J.S. et al. 'A new adaptive double envelope feedback (ADEF) linearizer for mobile radio power amplifiers', In: IEEE MIT-S International Microwave Symposium Digest, 1994, pp. 573-576.

Notification Concerning Transmittal of International Preliminary Report on Patentability PCT/US2011/058785 "Method and Apparatus for Power Amplifier Linearization," Date of Mailing, May 16, 2013.

International Search Report and Written Opinion of the International Searching Authority mailed Feb. 9, 2012 from PCT/US2011/058785, "Method and Apparatus for Power Amplifier Linearization," filed Nov. 1, 2011.

Notification Concerning Transmittal of International Preliminary Report on Patentability PCT/US2011/058786 "Field-Programmable Analog Array," Date of Mailing, May 23, 2013.

Notification of Transmittal of The International Search Report and the Written Opinion of the International Searching Authority, or the Declaration for PCT/US2012/062965, "Wideband Signal Processing," mailed Feb. 26, 2013.

Notification of Transmittal of The International Search Report and the Written Opinion of the International Searching Authority, or the Declaration for PCT/US2009/001512, "Method, System, and Apparatus for Wideband Signal Processing," mailed Oct. 20, 2009.

Supplementary European Search Report, Application No. EP 09721007, "Method, System, and Apparatus for Wideband Signal Processing," dated Nov. 17, 2011.

Notification of Transmittal of The International Search Report and the Written Opinion of the International Searching Authority, of the Declaration, PCT/US2011/024542, "Broadband Analog Radio-Frequency Components," Date Mailed: Oct. 31, 2011, 3620.1009-002.

International Preliminary Report on Patentability, International Application No. PCT/US2011/024542, "Broadband Analog Radio-Frequency Components," Date Mailed: Aug. 23, 2012.

Notification of Transmittal of The International Search Report and the Written Opinion of the International Searching Authority, or the Declaration for PCT/US2011/058786, "Field Programmable Analog Array," mailed Jun. 29, 2012.

Notification Concerning Transmittal of International Preliminary Report on Patentability PCT/US2013/057996 "Bi-Quad Calibration" Date of Mailing, Mar. 19, 2015.

Notification Concerning Transmittal of International Preliminary Report on Patentability, International Application No. PCT/US2012/062965, "Wideband Signal Processing," date mailed, May 15, 2014.

*Notice of Allowance in U.S. Appl. No. 12/921,987, dated May 7, 2014.

*Notice of Allowance in U.S. Appl. No. 13/576,635, dated Jul. 11, 2014.

Supplementary European Search Report, Application No. EP 11790125, "Broadband Analog Radio-Frequency Components," date May 12, 2014.

* cited by examiner

BI-QUAD CALIBRATION

RELATED APPLICATIONS

This application claims the benefit of U.S. Provisional Application No. 61/779,390, filed on Mar. 13, 2013, and U.S. Provisional Application No. 61/697,049, filed Sep. 5, 2012. The entire teachings of the above applications are incorporated herein by reference.

BACKGROUND OF THE INVENTION

Increases in signal bandwidth and data rates have prompted the development of new signal processing techniques to solve challenges associated with wideband signals. Increased signal bandwidth has also made new applications possible, including ultrawideband (UWB) technology-based active radio-frequency (RF) identification (ID) in heterogeneous environments. In addition, increasing signal bandwidth improves ranging accuracy, making wideband technologies especially attractive for radar, imaging, and other applications.

Unfortunately, fundamental scaling limits on clock speed, switching, heat dissipation, and difficulty of fault recovery make digital logic unsuitable for wideband signal processing. For example, today's DSP technology cannot process the wideband signals required for emerging applications such as high-definition TV, software-defined radio, cognitive radio, 4-G handheld services, white spaces, UWB-based services, and real-time GHz/THz medical imaging. Beyond the need for greater speed and bandwidth processing capability, methods for reducing power consumption also have huge appeal and utility in many signal processing applications. For example, a huge premium is placed on power consumption in mobile devices; high-speed DSPs are a huge drain on the battery life of cell-phones and PDAs.

For wideband applications, the Nyquist rate is in the multiple Gsps range and, hence, only relatively simple signal processing can be implemented and often requires highly pipelined and parallel processing architectures. Going forward, DSP technology is unlikely to reach the capabilities required by these applications because the limits of CMOS-based digital signal processing structures are not expanding according to Moore's Law any more. In fact, deep sub-micron CMOS gates have widths measured in molecules, suggesting that transistor sizes (and switching speeds) are nearing their fundamental limits. In other words, there is little room to increase the bandwidth processing ability of DSP technology because transistor switching speed, which is inversely related to transistor size, cannot get much faster.

Analog logic, in turn, has its own limitations. Because analog circuits are not formed of truly independent blocks, changing one block of analog logic can force changes in every other block in the circuit. In addition, advances in process technology occur so quickly that application-specific designs often become obsolete before they are fabricated. Finally, analog circuits are neither fully reconfigurable nor fully programmable.

SUMMARY OF THE INVENTION

Embodiments of the present invention include methods of tuning state variable filters. Examples include state variable filters whose center frequencies can be tuned using variable gain blocks coupled to outputs of filter integrators. First- and second-order state variable filters may operate on signals in parallel and their outputs combined to produce a filtered output. Filters may be tuned to pass or reject signals depending on the application; sample applications include, but are not limited to: agile filtering; spectrum analysis; interference detection and rejection; equalization; direct intermediate-frequency transmission; and single-sideband modulation and demodulation.

In an example embodiment, a method of tuning a filter of a biquad circuit (state variable filter) includes tuning a loss pad to generate a target gain value at a predetermined frequency. A phase of a first integrator is tuned to a target phase at the predetermined frequency. A phase of a second integrator is then tuned to the target phase at the predetermined frequency. A gain of the first integrator is tuned to a target gain value at the predetermined frequency. Lastly, a gain of the second integrator is tuned to the target gain value at the predetermined frequency.

In further embodiments, the target gain at the predetermined frequency is determined. Tuning the loss pad may include adjusting an attenuation value at the loss pad. Tuning the phase of the first integrator may include adjusting a phase value of an input at the first integrator, the phase value controlling the phase of the first integrator. Tuning the gain of the first integrator may include adjusting a coarse gain value and adjusting a fine gain value at the first integrator, the coarse gain value and fine gain value controlling the gain of the first integrator. Tuning the phase of the second integrator may include adjusting a phase value of an input at the second integrator, the phase value controlling the phase of the second integrator. Tuning the gain of the second integrator may include adjusting a coarse gain value and adjusting a fine gain value at the second integrator, the course gain value and fine gain value controlling the gain of the second integrator.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

Figure 1:
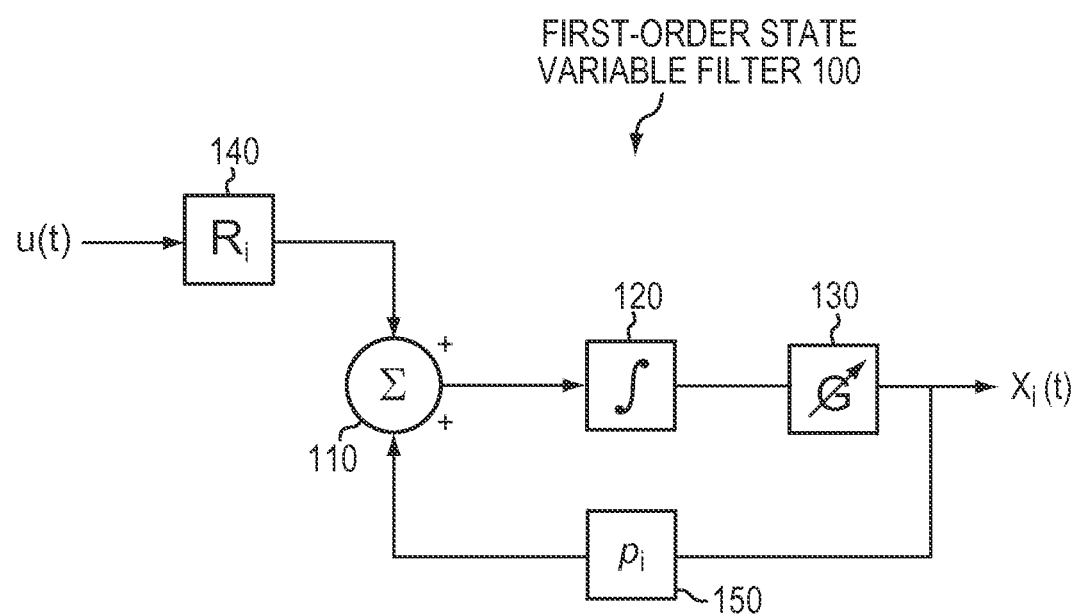
FIG. 1 is a block diagram of a first-order state variable filter.

A description of example embodiments of the invention follows.

Wideband and ultrawideband (UWB) communication systems, which spread signal energy finely across an enormous frequency band (e.g., 3.7-10.0 GHz), appear promising for many wireless applications. Many of wideband communication's attributes—accurate ranging, material penetration, overlay, and robustness to multipath fading in low-power systems operating in extreme environments—directly address the critical challenges facing challenging military and commercial applications, such as radio-frequency identification (RFID). In addition, wideband systems that operate at baseband do not require down-conversion at the receiver, simplifying the required receiver.

The challenges of designing a wideband system with finely spread energy over an extremely large frequency band to meet the overlay requirement soon become apparent to communication system designers. In particular, one generally selects a receiver design that is scalable to extreme bandwidths (7 GHz now, potentially larger in the future) from among all-digital receivers, analog correlators for partial or full rake receivers, and transmitted reference receivers.

Analog-to-digital (A/D) conversion limits the bandwidth and dynamic range (resolution) of all-digital receivers. At present, the high-fidelity A/D converters capable of adequately sampling baseband UWB signals are too complex and consume too much power, particularly for RFID applications. Alternative all-digital systems rely on low-resolution A/D converters, but do not perform as well. For analog correlators, as the bandwidth grows, the number of rake fingers for efficient energy capture increases, and, thus, so does the circuit complexity and difficulty of channel estimation. Although transmitted reference receivers are attractive for low-to-moderate data rate operations, they require large-bandwidth delay lines at the receiver for UWB applications.

Here, we disclose wideband signal processing (WiSP) that augments digital signal processing and vastly improves the bandwidth processing capability of such systems. The disclosed WiSP systems and techniques provide general-purpose signal processing for wideband signals by implementing and extending digital functionalities in the analog domain. Embodiments of the disclosed invention employ a state variable-based architecture to implement any desired impulse response or transfer function to a specifiable degree of accuracy. All filter parameters, including center frequency, can be controlled and optimized through algorithms running on a low data rate, wideband digital signal processor (DSP) or other suitable control element running in the control path. Wideband signal processors can be implemented on sub-micron complementary metal-oxide-semiconductor (CMOS) structures to permits processing of broadband signals, including signals whose bandwidths exceed 10 GHz.

Embodiments of the disclosed WiSP systems and devices include dynamically and reconfigurable filters that can be used as or in: wideband filters; agile filters; adaptive filters; equalizers; direct intermediate-frequency (IF) transmitters; and single-sideband modulators and demodulators. Filters, processors, equalizers, and tapped delay lines made according to principles of the present invention can be used in a wide variety of applications, including, but not limited to: active RFID; radar; imaging; software-defined radio; cognitive radio; baseband processors; instrumentation; and wireless high-definition multimedia interfacing. These lists of components and applications are not exhaustive; rather, they are representative of components and applications suitable for manufacture or use according to principles of the present invention.

Filters for Analog Signal Processing

Classic signal processing systems operate on two planes. In the signal plane (S-plane), signals are manipulated using filters and other processing operations. In the control plane (C-plane), the signal processing operations are provisioned and manipulated. For example, in an adaptive equalization system, signals pass through a transversal filter, but the coefficients of the filter are controlled by the C-plane. Today, both these functions are done by DSPs. The underlying mathematical basis for digital signal processing is based on S-plane theory, synchronous sampling at or above the Nyquist sampling rate—governed by the sampling theorem. Needless to say, systems implementing such functionality rely on the use of DSP, A/D, and digital-to-analog (D/A) technologies.

In embodiments disclosed here, the S-plane undergoes sophisticated analog signal processing (the signal path is all analog) while maintaining 10+ GHz of bandwidth. The C-plane, however, is implemented in a traditional A/D, D/A, and DSP architecture. Embodiments disclosed herein have extremely low power consumption relative to today's standards because of the resulting low gate count and block-architecture of these hybrid systems.

Filters are building-block components for analog signal processors that alter the amplitude and/or phase characteristics of a signal with respect to frequency, making it possible to process signals in the S-plane. Filters are used to pass signals within certain frequency ranges and to reject those in other ranges. Bandpass filters transmit only those frequencies that fall within a given band. Notch or band-reject filters, on the other hand, remove specific frequencies while allowing all other frequencies to pass undisturbed. Low-pass and high-pass filters reject frequencies above and below, respectively, a cut-off frequency. All-pass filters impart phase shifts on an input signal without attenuating the signal.

A filter's frequency response can be represented mathematically by a transfer function, which is the ratio of the Laplace Transforms of its output and input signals. Ideal filters have rectangular transfer functions; that is, transfer functions with infinitely steep boundaries between the pass and stop bands, and a constant gain in the pass band. In addition, ideal filters have linear phase responses to avoid introducing phase distortion into the signal. Real filters can only approximate the ideal response.

The order of a filter equals the order of the polynomial expansion of the filter's transfer function. In conventional RF systems, higher-order filters are constructed by cascading (i.e., serially connecting) lower-order filters. For example, a third-order filter can be constructed by connecting the output of a first-order filter to the input of a second-order filter. Higher-order filters typically have improved pass band performance and a faster roll-off (attenuation in the stop band) than lower-order filters.

Filter Design, Implementation, and Operation

Normally, when designing filters, the goal is to implement a particular transfer function or impulse response. Transfer functions corresponding to rational functions take the form:

$$T_{mn}(s) = \frac{b_m s^m + b_{m-1} s^{m-1} + \ldots + b_0}{s^n + a_{n-1} s^{n-1} + \ldots + a_0} \quad (1)$$

where $s=j\omega$ and is given in rad·Hz. Solutions to the numerator are the filer's zeros; solutions to the denominator are the filter's poles. A partial fraction expansion can be done on this expression, followed by an inverse Laplace transform, allowing any temporal function to be expressed as a sum of complex sinusoids:

$$T_{mn}(s) = \sum_{i=1}^{n} \frac{R_i}{s - p_i} \Leftrightarrow y_{mn}(t) = \sum_{i=1}^{n} R_i e^{p_i t} \quad (2)$$

This approximation can be made accurate to an arbitrary degree of accuracy by adding additional terms in the summation.

In order to develop an expression for the impulse response in the form of a summation of complex sinusoids, as in equation (2), the Padé approximation, Prony's method, or any other suitable method can be employed to determine values of $R_i$ and $p_i$ of $y_{mn}(t)$. Once $y_{mn}(t)$ is known, it is possible to use state variable techniques. The system described by equation (3) has a solution $y(t)$ that is in the same form as $y_{mn}(t)$ from equation (2).

$$\begin{cases} \dot{x} = \begin{bmatrix} -p_1 & & & & \\ & -p_2 & & 0 & \\ & & -p_3 & & \\ & 0 & & \ddots & \\ & & & & -p_n \end{bmatrix} x + \begin{bmatrix} R_1 \\ R_2 \\ R_3 \\ \vdots \\ R_n \end{bmatrix} u \\ y = [1 \ 1 \ 1 \ \ldots \ 1] x \end{cases} \quad (3)$$

Applying Prony's method or the Padé approximation yields a list of $R_i$ and $p_i$ values, some of which are real and some of which are complex. The complex pole/residue pairs occur as complex conjugate pairs and can be combined as:

$$\begin{aligned} T_p(s) &= \frac{R_i}{s - p_i} + \frac{R_i^*}{s - p_i^*} \quad (4) \\ &= \frac{2Re[R_i]s - 2Re[p_i R_i^*]}{s^2 - 2Re[p_i]s + [p_i]^2} \\ &= \frac{b_1 s + b_0}{s^2 + a_1 s + a_0} \end{aligned}$$

where all the filter coefficients (a's and b's) are real. These conjugate pairs can be realized using the second-order control and observer canonical forms described in greater detail below.

FIG. 1 shows a first-order state variable filter 100 used to implement real solutions to equations (2) and (3). The first-order state variable filter 100 operates on a wideband input u(t) to produce a filtered output $x_i$ (t). A residue block 140 determines the input's residue $R_i$, which is forwarded to a summer 110 that combines the residue with a pole $p_i$ of the filtered output. The summer 110 forwards the sum of the residue and the pole to an integrator 120. Unlike conventional first-order state variable filters, the first-order state variable filter 100 includes a variable gain block 130 that operates on the output of the integrator 120. The variable gain block 130 amplifies or attenuates the integrated signal according to its gain settings G to produce the filtered output. A pole block 150 coupled to the variable gain block 130 produces the pole $p_i$ of the filtered output, which is fed back to the summer 110. Changing the parameters of the pole block 150 and the residue block 140 (i.e., changing the filter tap weights) changes the filter transfer characteristics, including the filter center frequency and pass bandwidth.

Re-examining the first-order state variable filter 100 shown in FIG. 1 shows that the effect of the variable gain block 130 is very interesting. Rather than amplifying the signal, the variable gain block 130 acts as a frequency scale when preceded by the integrator 120 (which is equivalent to 1/s in the Laplace domain). The variable gain block 130 transforms the filter transfer function T(s) into T(s/G), where G is the gain of the variable gain block 130. Given that $s=j\omega=j\pi f$, scaling s by 1/G effectively scales T(s) in frequency by the same factor of G. Varying G causes the center frequency of the filter passband to tune across the UWB band.

Figure 2A:
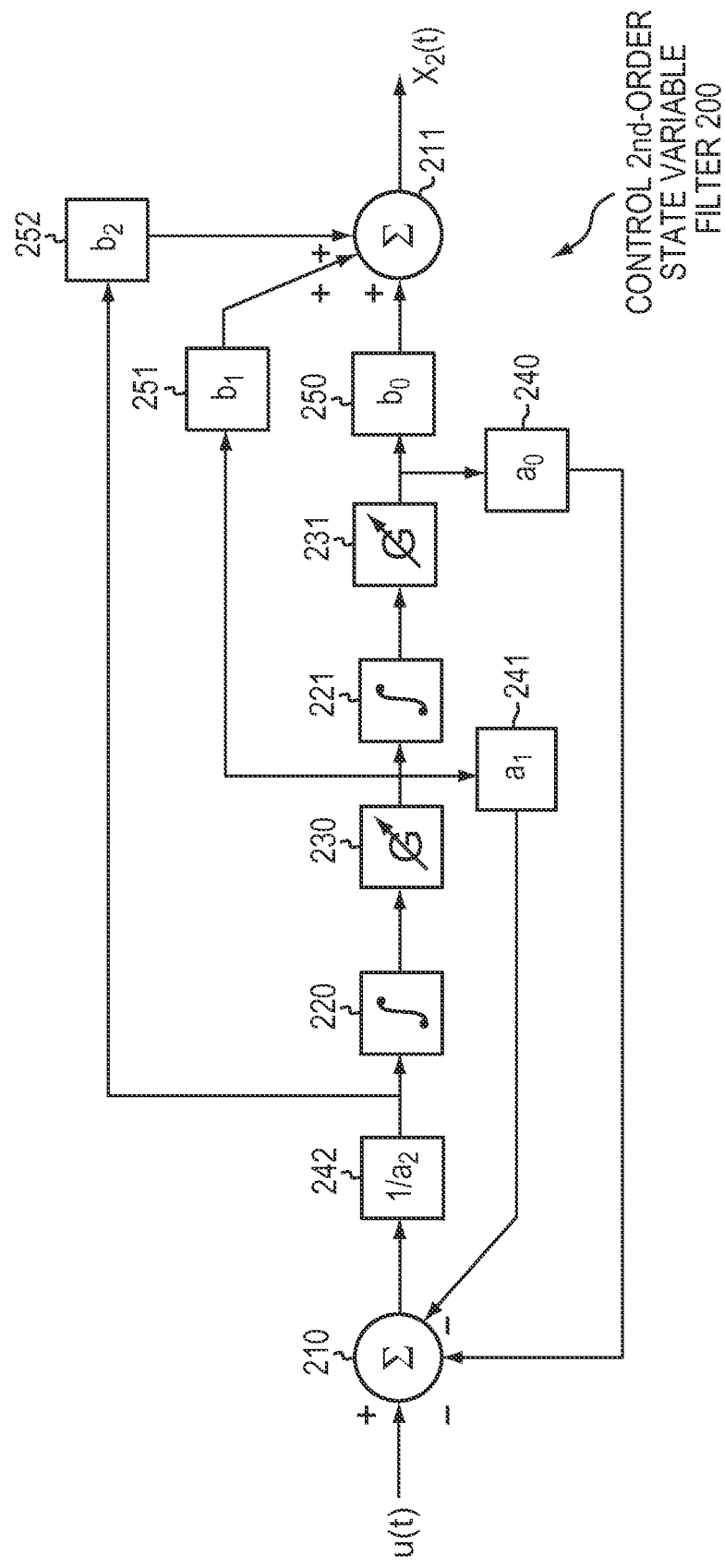
FIG. 2A is a block diagram of a control canonical form of a second-order state variable filter.
Figure 3:
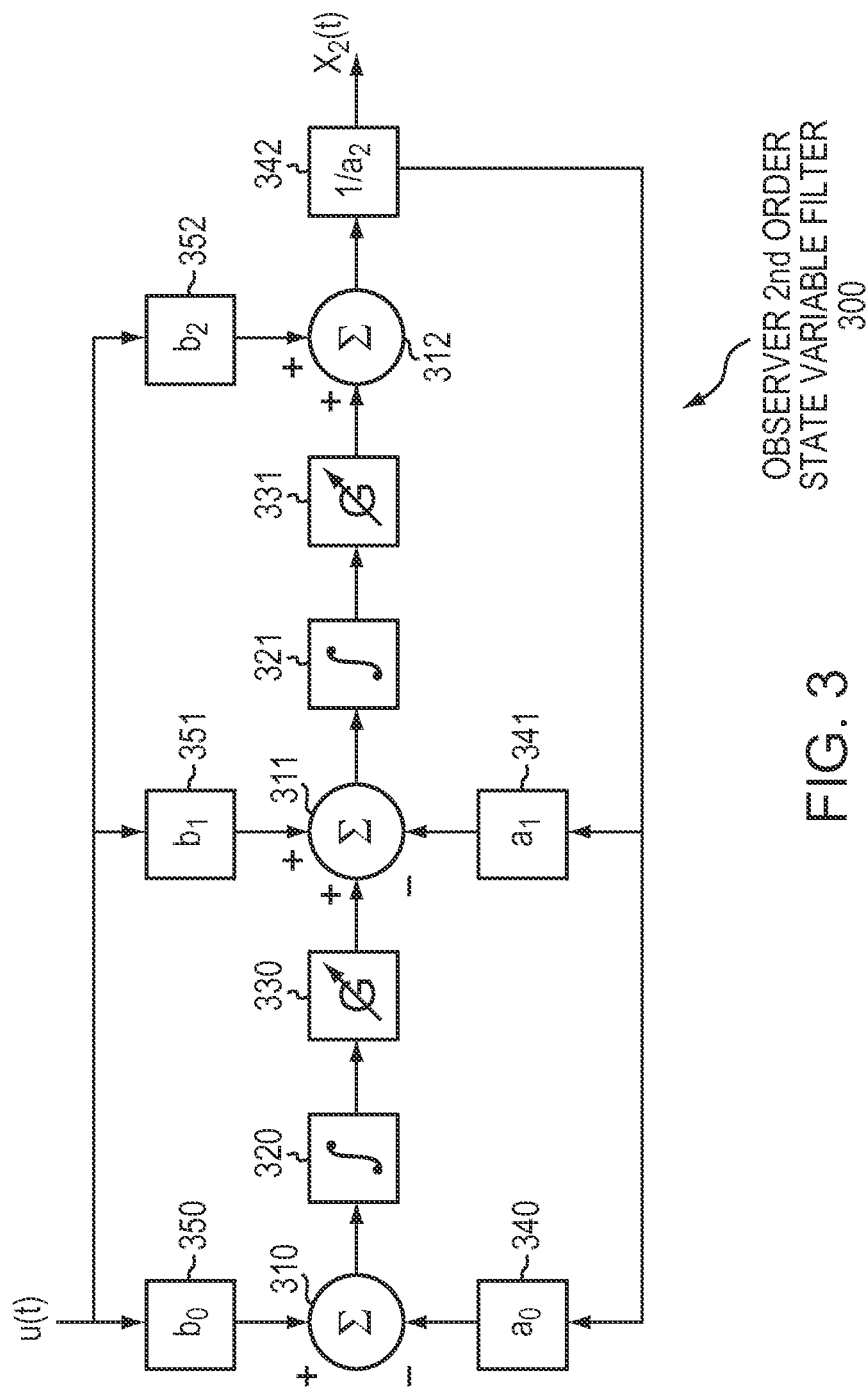
FIG. 3 is a block diagram of an observer canonical form of a second-order state variable filter.

FIGS. 2A and 3 show second-order state variable filters 200 and 300 in control and observer canonical forms, respectively, that realize second-order solutions to equations (2) and (3). The two forms are mathematically equivalent, but the observer form 300 requires an additional summer and has differently configured inputs and outputs. Like the first-order state variable filter 100 shown in FIG. 1, the second-order filters 200 and 300 include variable gain blocks that change the center frequency of the filter passband. They also include tap weights, or fractional gain blocks, that represent coefficients (i.e., $a_0$, $a_1$, $a_2$, $b_0$, $b_1$, and $b_2$) of the transfer function in equation (4). Like the variable gain blocks, the fractional gain blocks attenuate or amplify signals according to a corresponding coefficient. Typically, the variable and fractional gain blocks scale signals to a value within a normalized range of −1 to 1, inclusive.

The control second-order state variable filter 200 shown in FIG. 2 operates on a wideband input u(t) to produce a filtered output $x_2$ (t). A summer 210 combines the wideband input with outputs from fractional gain blocks 240 and 241. The summer 210 passes the difference of the wideband input and the fractional gain block outputs to a third fractional gain block 242, which scales the summer output by an amount $1/a_2$. The fractional gain block 242 forwards the scaled summer output to an integrator 220 and a fractional gain block 252, which scales the scaled summer output by $b_2$.

The integrator 220 integrates the scaled signal, then forwards a resulting integrated signal to a variable gain block 230, which tunes the passed signal frequency according to its gain setting $G_1$. The output of the variable gain block 230 is forwarded to a second integrator 221 and fractional gain blocks 241 and 251, which scale the output by $a_1$ and $b_1$, respectively. The second integrator 221 integrates the signal again, then forwards a resulting second integrated signal to a variable gain block 231. The output of the variable gain block 231 is forwarded to fractional gain blocks 240 and 250, which scale the output by $a_0$ and $b_0$, respectively. A summer 211 combines the outputs of the fractional gain blocks 250-252 to provide the filtered output.

Figure 2B:
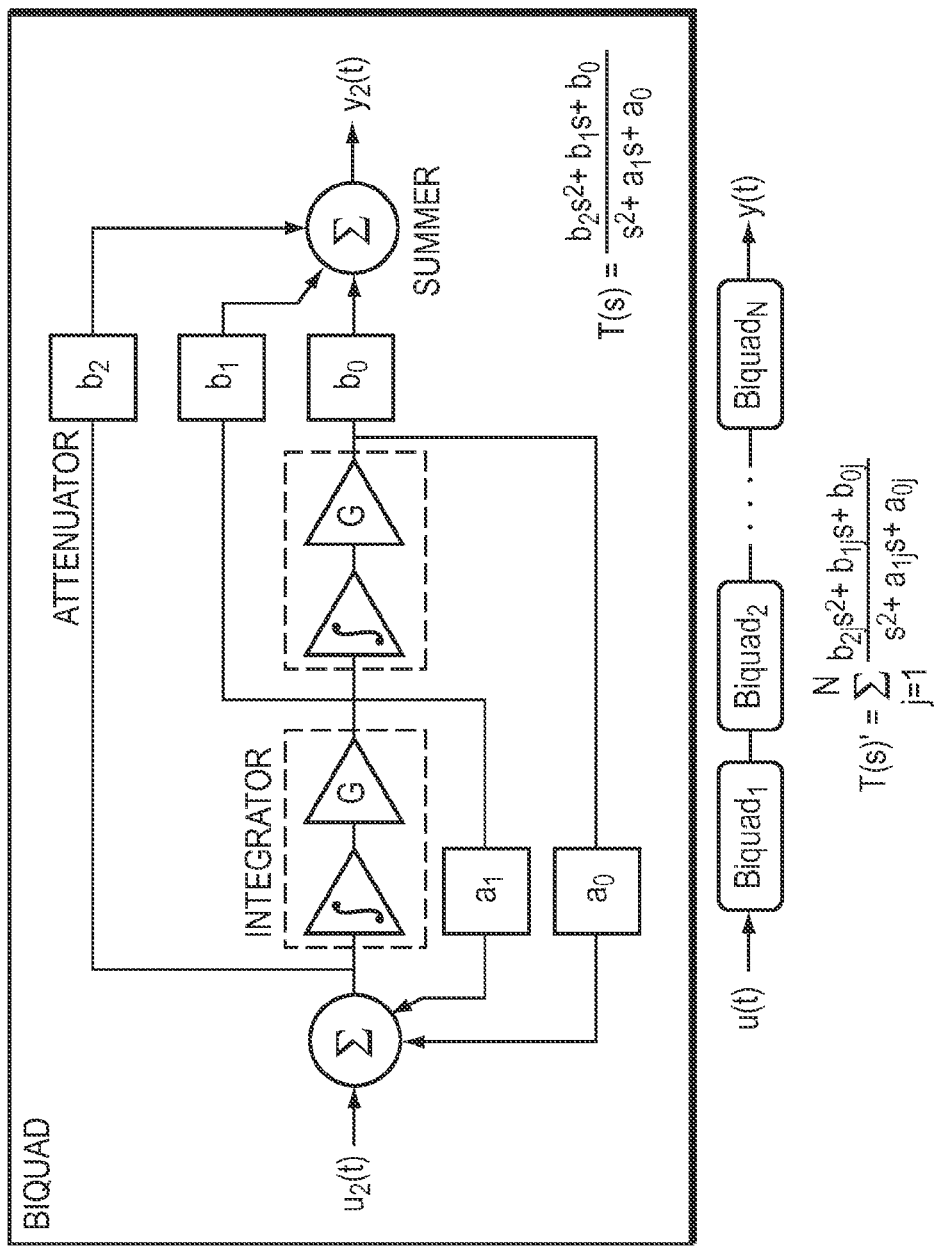
FIG. 2B is a block diagram of a configuration of biquad circuits in which embodiments of the invention may be implemented.

FIG. 2B illustrates a series of state variable filter circuits (also referred to as "biquad circuits"), such as the filter 200 described above in FIG. 2A. The biquad configuration is a second order state variable structure. $2N^{th}$ order transfer function T(s)' is obtained by cascading N biquads.

The transfer functions shown in FIG. 2B also describe a single input single output (SISO) field programmable analog array (FPAA). By varying the values of the attenuators and the integrator gains, one can obtain an assortment of adaptive filter and delay line characteristics. The ability to work in the analog domain offers engineers a powerful tool to process wideband signals.

The observer second-order state variable filter 300 shown in FIG. 3 operates on a wideband input u(t) to produce a filtered output $x_2$ (t) in much the same way as the filter 200 shown in FIG. 2. Here, however, fractional gain blocks 350, 351, and 352 scale the wideband input by amounts $b_0$, $b_1$, and $b_2$, respectively, and forward the resulting scaled outputs to summers 310, 311, and 312, respectively. The summer 310 combines (subtracts) a scaled output from fractional gain block 340 with (from) the output of fractional gain block 350 to provide a combined signal.

An integrator 320 integrates the resulting signal, then forwards a resulting integrated signal to a variable gain block 330, which tunes the passed signal frequency according to its gain setting. A second summer 311 combines the output of the variable gain block 330 with outputs from fractional gain blocks 341 and 351 to provide a second combined output.

A second integrator 321 integrates the second combined output, then forwards a resulting second integrated signal to a second variable gain block 331. A third summer 312 combines the second variable gain block's output with the output of the fractional gain block 352 to provide a third combined signal. A fractional gain block 342 scales the third combined signal by $1/a_2$ to provide the filtered output. The filtered output is forwarded to fractional gain blocks 340 and 341, which scale the filtered output by $a_0$ and $a_1$, respectively.

The first- and second-order state variable filters shown in FIGS. 1-3 can be generalized to any order by incorporating or removing additional integrators and variable gain blocks as appropriate. An nth-order state variable filter can be constructed by coupling a variable gain block to the respective outputs of each of n integrators. Higher-order state variable filters may also include additional functional gain blocks and summers configured to scale and combine signals at various points throughout the filter. Setting a functional gain block's scaling coefficient to 0 or 1 (depending on the filter configuration) effectively suppresses the functional gain block's effect on the filter's operation. Further, a series of multiple biquad circuits may be connected in series, as described above with reference to FIG. 2B, to obtain a $2N^{th}$ order transfer function T(s)' by cascading N biquad circuits.

Figure 4:
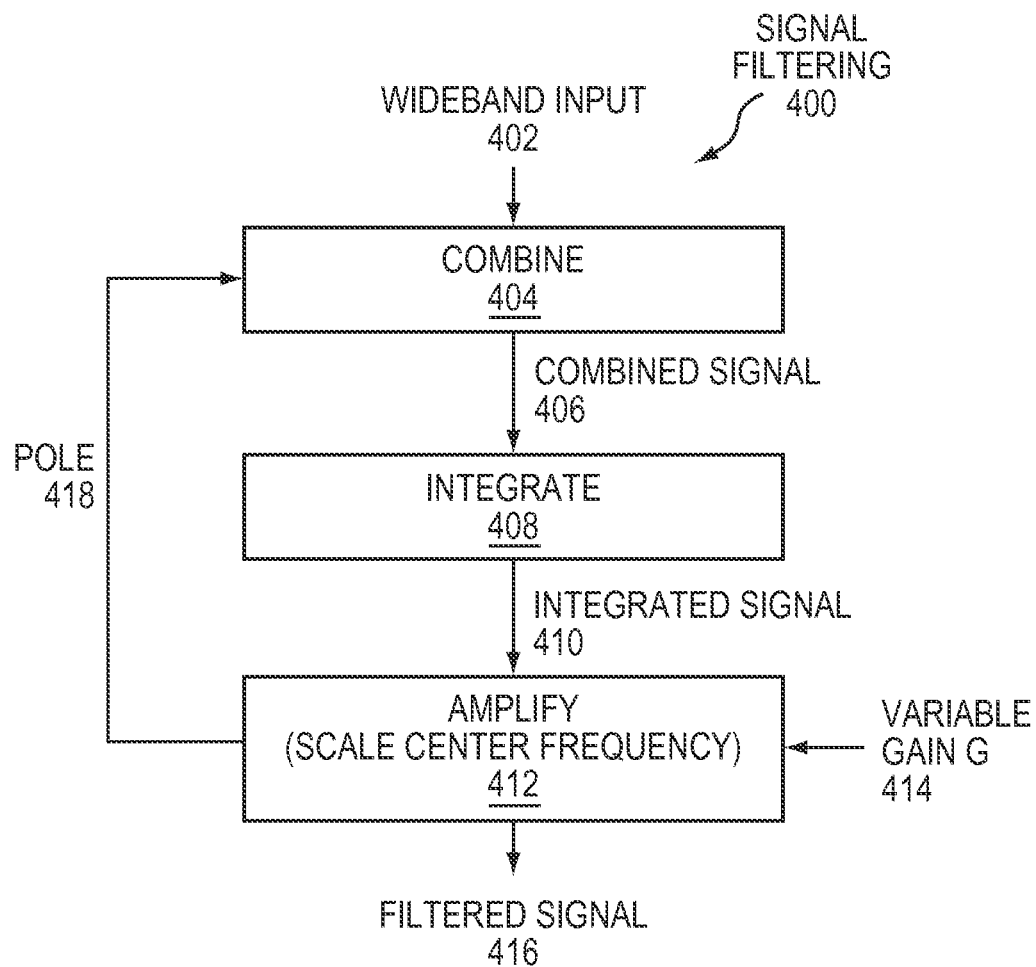
FIG. 4 is flow diagram that illustrates signal filtering according to principles of the present invention.

FIG. 4 is a flow diagram that illustrates basic signal filtering 400 according to principles of the present invention. First, a wideband input 402 is combined (404) with a pole 418 to produce a combined signal 406, where the pole 418 is determined from a filtered signal 416 derived through the signal filtering 400. In higher-order filtering, the pole 418 may be derived by scaling the filtered signal 416 with a fractional gain coefficient. The combined signal 406 is integrated (408) to produce an integrated signal 410, which is amplified (412) by a variable gain 414 to produce the filtered signal 416. Changing the variable gain 414 shifts the center frequency of the filtered signal 416.

Example embodiments of the present invention provide methods for tuning a state variable filter (also referred to herein as a "biquad filter") such as those described above with reference to FIGS. 1-4. Embodiments of wideband filters usable with the present invention are described in further detail in "Method, System, and Apparatus for Wideband Signal Processing," (U.S. patent application Ser. No. 12/921, 987; PCT Application No. PCT/US2009/001512), and "Wideband Signal Processing" (U.S. patent application Ser. No. 13/666,269; PCT Application No. PCT/US2012/ 062965), the teachings of which are incorporated herein in their entirety. A tuning procedure, as described below, may be performed in order to increase the filter's performance in a number of ways, such as by compensating for potential inaccuracies inherent in its implementation as an integrated circuit. As a result of the tuning procedure, a greater degree of precision is created than would otherwise be achievable.

Figure 5A:
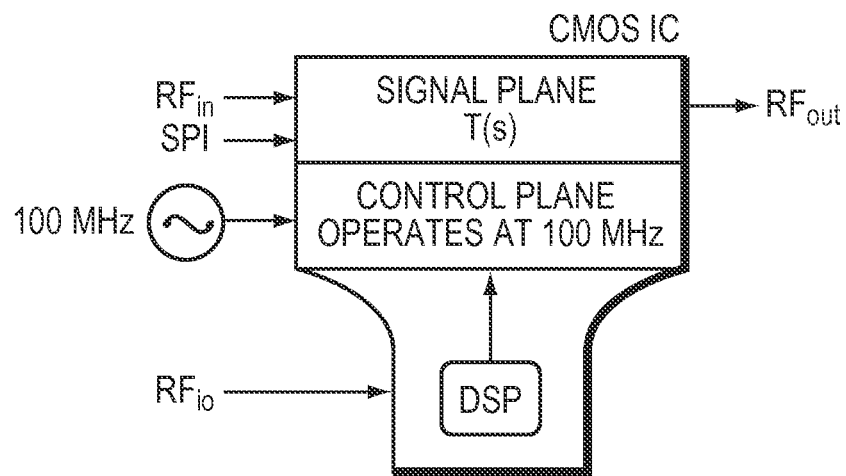
FIG. 5A is a block diagram of a signal interface at a state variable filter.

FIG. 5A is a block diagram of a signal interface at a state variable filter, illustrating both data signal and control planes. The interface may be implemented with a state variable filter such as those described above with reference to FIGS. 1-4. The control plane interacts with the signal plane in order to tune the filter, and thereby the biquad's cascaded constructions that implement biquad filters. The control plane may operate at a lower frequency than the biquad's operating range (e.g., 100 MHz) and provides a measurement mechanism that improves the biquad's performance by accurately setting the gain and phase of its subcomponents (such as loss pads and integrators). Measurements are output from the control plane to an ADC and are used to change circuit values within the biquad to improve accuracy. A serial peripheral interface (SPI) interface is used to read and write values within the biquad. The biquad's SPIs may be treated as slaves to a microprocessor/digital signal processor (µP/DSP) master.

SPI addresses are distributed within the biquad in order to change circuit values. Taking an $8^{th}$ order bandpass filter as an example, there are:

a) 5 SPI interfaces per Biquad, with 4 Biquads in a filter and one additional test biquad for calibration purposes b) 3 SPI interfaces combined for source and measure (buses within the control plane for sourcing signals and taking measurements)

c) 1 SPI interface for Mode identification d) Total of a)-c) is 29 SPI interfaces for the 8th Order Bandpass Filter.

Figure 5B:
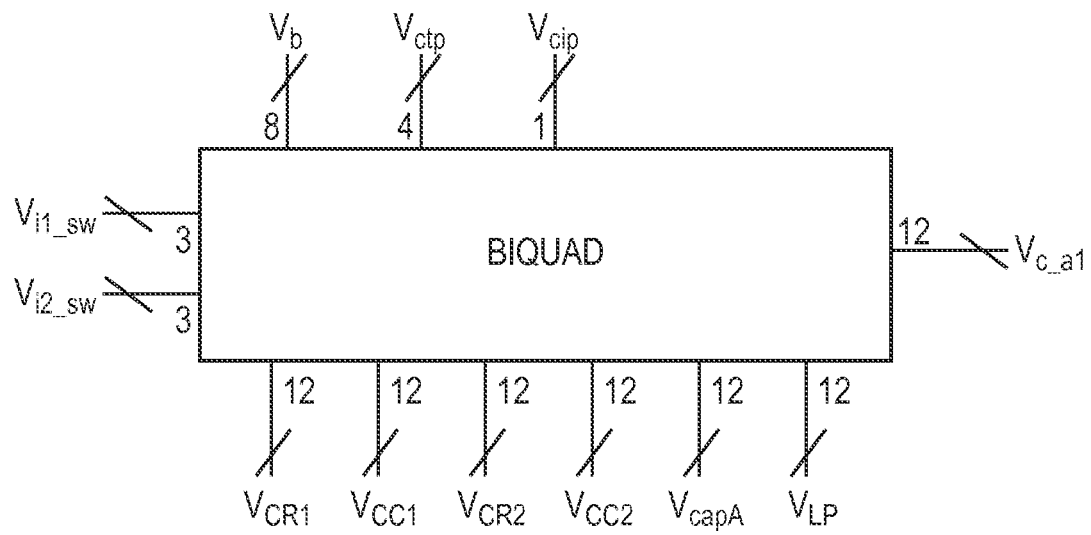
FIG. 5B is a block diagram of serial peripheral interface (SPI) data assignment for a state variable filter.
Figure 5C:
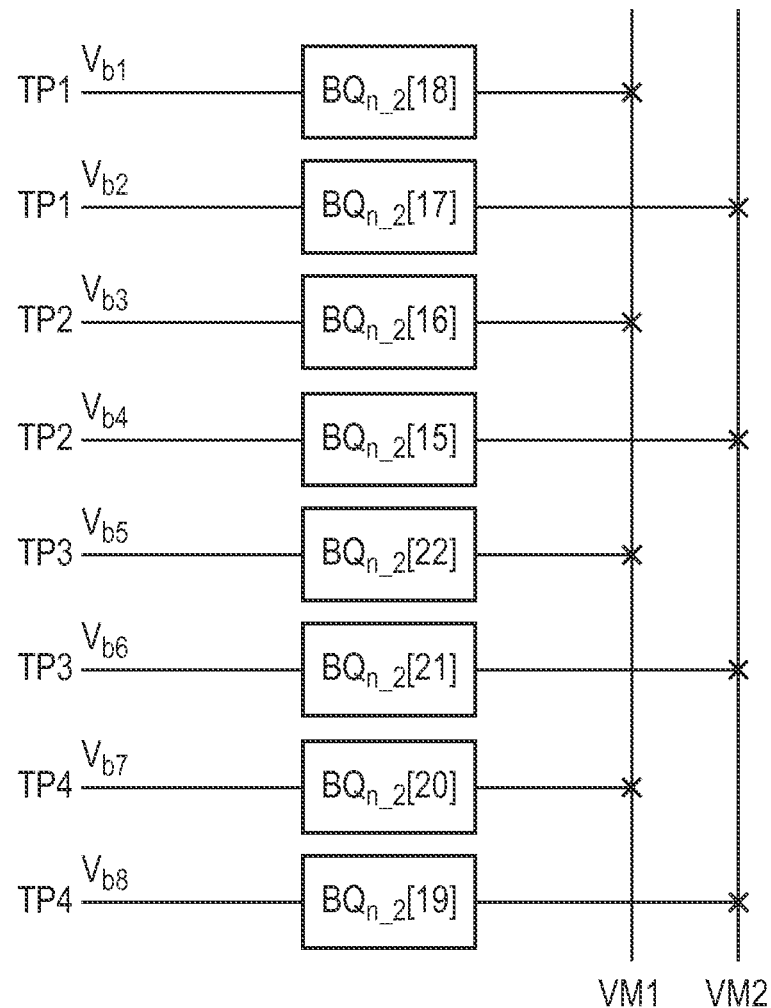
FIG. 5C is a block diagram illustrating test point connections to measure operation of the state variable filter.

FIGS. 5B-C are block diagrams illustrating data and test point connections at an example biquad circuit. The connections are utilized in the example tuning procedures described below with reference to FIGS. 6-16B. FIG. 5B illustrates an example SPI Data Assignment for the biquad, and FIG. 5C illustrates test point connections to measure operation of the biquad. An example registry and address configuration for the data and test point connections of FIGS. 5B-C is provided in Tables 1-5, below.

TABLE 1

SPI Address Assignment

| Reg | SPI Register Address Bits | | | | | | | Data Bits & Description |
|---|---|---|---|---|---|---|---|---|
| | A6 | A5 | A4 | A3 | A2 | A1 | A0 | D24:D0 |
| BQ1_1 | 0 | 0 | 0 | 0 | 0 | 0 | 0 | Biquad 1 Register 1 |
| BQ1_2 | 0 | 0 | 0 | 0 | 0 | 0 | 1 | Biquad 1 Register 2 |
| BQ1_3 | 0 | 0 | 0 | 0 | 0 | 1 | 0 | Biquad 1 Register 3 |
| BQ1_4 | 0 | 0 | 0 | 0 | 0 | 1 | 1 | Biquad 1 Register 4 |

TABLE 1-continued

SPI Address Assignment

| Reg | A6 | A5 | A4 | A3 | A2 | A1 | A0 | D24:D0 |
|---|---|---|---|---|---|---|---|---|
| BQ1_5 | 0 | 0 | 0 | 0 | 1 | 0 | 0 | Biquad 1 Register 5 |
| BQ2_1 | 0 | 0 | 0 | 1 | 0 | 0 | 0 | Biquad 2 Register 1 |
| BQ2_2 | 0 | 0 | 0 | 1 | 0 | 0 | 1 | Biquad 2 Register 2 |
| BQ2_3 | 0 | 0 | 0 | 1 | 0 | 1 | 0 | Biquad 2 Register 3 |
| BQ2_4 | 0 | 0 | 0 | 1 | 0 | 1 | 1 | Biquad 2 Register 4 |
| BQ2_5 | 0 | 0 | 0 | 1 | 1 | 0 | 0 | Biquad 2 Register 5 |
| BQ3_1 | 0 | 0 | 1 | 0 | 0 | 0 | 0 | Biquad 3 Register 1 |
| BQ3_2 | 0 | 0 | 1 | 0 | 0 | 0 | 1 | Biquad 3 Register 2 |
| BQ3_3 | 0 | 0 | 1 | 0 | 0 | 1 | 0 | Biquad 3 Register 3 |
| BQ3_4 | 0 | 0 | 1 | 0 | 0 | 1 | 1 | Biquad 3 Register 4 |
| BQ3_5 | 0 | 0 | 1 | 0 | 1 | 0 | 0 | Biquad 3 Register 5 |
| BQ4_1 | 0 | 0 | 1 | 1 | 0 | 0 | 0 | Biquad 4 Register 1 |
| BQ4_2 | 0 | 0 | 1 | 1 | 0 | 0 | 1 | Biquad 4 Register 2 |
| BQ4_3 | 0 | 0 | 1 | 1 | 0 | 1 | 0 | Biquad 4 Register 3 |
| BQ4_4 | 0 | 0 | 1 | 1 | 0 | 1 | 1 | Biquad 4 Register 4 |
| BQ4_5 | 0 | 0 | 1 | 1 | 1 | 0 | 0 | Biquad 4 Register 5 |
| BQ5_1 | 0 | 1 | 0 | 0 | 0 | 0 | 0 | Test Biquad Register 1 |
| BQ5_2 | 0 | 1 | 0 | 0 | 0 | 0 | 1 | Test Biquad Register 2 |
| BQ5_3 | 0 | 1 | 0 | 0 | 0 | 1 | 0 | Test Biquad Register 3 |
| BQ5_4 | 0 | 1 | 0 | 0 | 0 | 1 | 1 | Test Biquad Register 4 |
| BQ5_5 | 0 | 1 | 0 | 0 | 1 | 0 | 0 | Test Biquad Register 5 |
| Mode ID | 0 | 1 | 1 | 1 | 0 | 0 | 0 | Identifies mode (25-data bits give project, revision, etc. information) |
| MTR4 | 0 | 1 | 1 | 1 | 1 | 0 | 0 | Meter Register 4 |
| MTR6 | 0 | 1 | 1 | 1 | 1 | 1 | 0 | Meter Register 6 |
| MTR7 | 0 | 1 | 1 | 1 | 1 | 1 | 1 | Meter Register 7 |

TABLE 2

SPI Data Assignment for Biquad
(Address Bits from LSB 0 to MSB 24)

| SPI | Data Bits & Assignment | Data Bits & Assignment | Data Bits & Assignment | Data Bits & Assignment | Data Bits & Assignment |
|---|---|---|---|---|---|
| $BQ_{n\_1}$ | <0:11> = $V_{CR1}$ | <12:23> = $V_{CapA}$ | <24> = Unassigned | | |
| $BQ_{n\_2}$ | <0:11> = $V_{CC1}$ | <12:14> = $V_{i1\_sw}$ | <15:22> = $V_b*$ | <23> = $V_{cip}$ | <24> = Unassigned |
| $BQ_{n\_3}$ | <0:2> = $V_{i2\_sw}$ | <3:6> = $V_{ctp1,2,3,4}$ | <7:24> = Unassigned | | |
| $BQ_{n\_4}$ | <0:11> = $V_{CR2}$ | <12:23> = $V_{c\_a1}$ | <24> = Unassigned | | |
| $BQ_{n\_5}$ | <0:11> = $V_{LP}$ | <12:23> = $V_{CC2}$ | <24> = Unassigned | | |

TABLE 3

SPI Data Assignment for Source/Measure (LSB 0 to MSB 24)

| SPI | Data Bits & Assignment | Data Bits & Assignment | Data Bits & Assignment |
|---|---|---|---|
| $MTR_4$ | <0:11> = $B_{s90}$ | <12> = sel90 | <13:24> = Unassigned |
| $MTR_6$ | <0:11> = $B_{m2}$ | <12:23> = $B_{m1}$ | <24> = selbyp |
| $MTR_7$ | <0:11> = $B_s$ | <12> = seltbq | <13:24> = Unassigned |

TABLE 4

$V_b$ Control

| Voltage/Switch | SPI bit | Active | Connection | Function |
|---|---|---|---|---|
| $V_{b1}$ | $BQ_{n\_2}$<18> | High | TP1 to VM1 | Input of the 1st Integrator |
| $V_{b2}$ | $BQ_{n\_2}$<17> | High | TP1 to VM2 | |
| $V_{b3}$ | $BQ_{n\_2}$<16> | High | TP2 to VM1 | Output of the 1st Integrator, Input of the 2nd Integrator |
| $V_{b4}$ | $BQ_{n\_2}$<15> | High | TP2 to VM2 | |
| $V_{b5}$ | $BQ_{n\_2}$<22> | High | TP3 to VM1 | Output of the 2nd Integrator |
| $V_{b6}$ | $BQ_{n\_2}$<21> | High | TP3 to VM2 | |
| $V_{b7}$ | $BQ_{n\_2}$<20> | High | TP4 to VM1 | Loss Pad Output |
| $V_{b8}$ | $BQ_{n\_2}$<19> | High | TP4 to VM2 | |

TABLE 5

Switches and Connections

| Switch | SPI bit | Active | Connection and function |
|---|---|---|---|
| Vi1_sw[12] | BQ2<12> | Low | Selects first of 3 coarse-tuning sub-integrators in Integrator 1 Block |
| Vi1_sw[13] | BQ2<13> | Low | Selects second of 3 coarse-tuning sub-integrators in Integrator 1 Block |
| Vi1_sw[14] | BQ2<14> | Low | Selects third of 3 coarse-tuning sub-integrators in Integrator 1 Block |
| Vi2_sw[0] | BQ3<0> | Low | Selects first of 3 coarse-tuning sub-integrators in Integrator 2 Block |
| Vi2_sw[1] | BQ3<1> | Low | Selects second of 3 coarse-tuning sub-integrators in Integrator 2 Block |
| Vi2_sw[2] | BQ3<2> | Low | Selects third of 3 coarse-tuning sub-integrators in Integrator 1 Block |
| Vcip | BQ2<23> | Low | Injects 100 MHz source into biquad from control plane |
| Vctp1 | BQ3<3> | Low | Selects Test Point 1 in each biquad |
| Vctp2 | BQ3<4> | Low | Selects Test Point 2 in each biquad |
| Vctp3 | BQ3<5> | Low | Selects Test Point 3 in each biquad |
| Vctp4 | BQ3<6> | Low | Selects Test Point 4 in each biquad |
| sel90 | MTR4<12> | High/Low | Selects between 100 MHz 90° Reference and VM2 for measurement in control plane (High = 100 MHz 90° Reference, Low = VM2) |
| Seltbq | MTR7<12> | High/Low | Selects type of measurement for Test Biquad output in control plane (High = $TBQ^2$, Low = $(TBQ - 3\ dB)^2$) |
| Selbyp | MTR6<24> | High/Low | Selects between 100 MHz path and Test Biquad output for measurement in control plane (High = TBQ, Low = 100 MHz path) |

An example SPI connected to tune a biquad circuit may operate at a frequency of 40 MHz. Using a serial rapid I/O interface, the control plane can operate at speeds up to 20 Gbps. 32-bit words (7-bit address and 25-bit data registers) may be used to provision integrators and loss pads. An example 8th order bandpass filter may be made up of four biquads connected in series, where each biquad includes two integrators and one loss pad. Overall provisioning time is dependent on the details of the provisioning and tuning procedure.

Tuning Procedure

A procedure for tuning biquad circuits is described below.

a) Design a desired transfer function using classical techniques. Taking a bandpass filter as an example, determine filter type, order, center frequency, bandwidth, and passband ripple.

b) Factorize this transfer function in biquad sections. Taking an $8^{th}$ order bandpass filter as an example, the factorization will be of the form:

$$\prod_{n=1}^{4} \frac{k_n \frac{w_{r_n}}{Q_n} s}{s^2 + \frac{w_{r_n}}{Q_n} s + w_{r_n}^2}$$

c) For each of the 'n' biquads, determine coefficient parameters. Using the above example, these are k, $\omega_r$, Q.

d) Map these to the transfer function implemented by the biquad filter circuit. Using the $8^{th}$ order bandpass filter example, the mapping can be of the form:

$$\prod_{n=1}^{4} \frac{L_n G_{1_n} s}{s^2 + a_{1_n} G_{1_n} s + G_{1_n} G_{2_n}}$$

e) Perform tuning for each of the biquads. An example tuning procedure is described below with reference to FIG. 6, and further detail for each step of FIG. 6 is provided in FIGS. 7-11.

Figure 6:
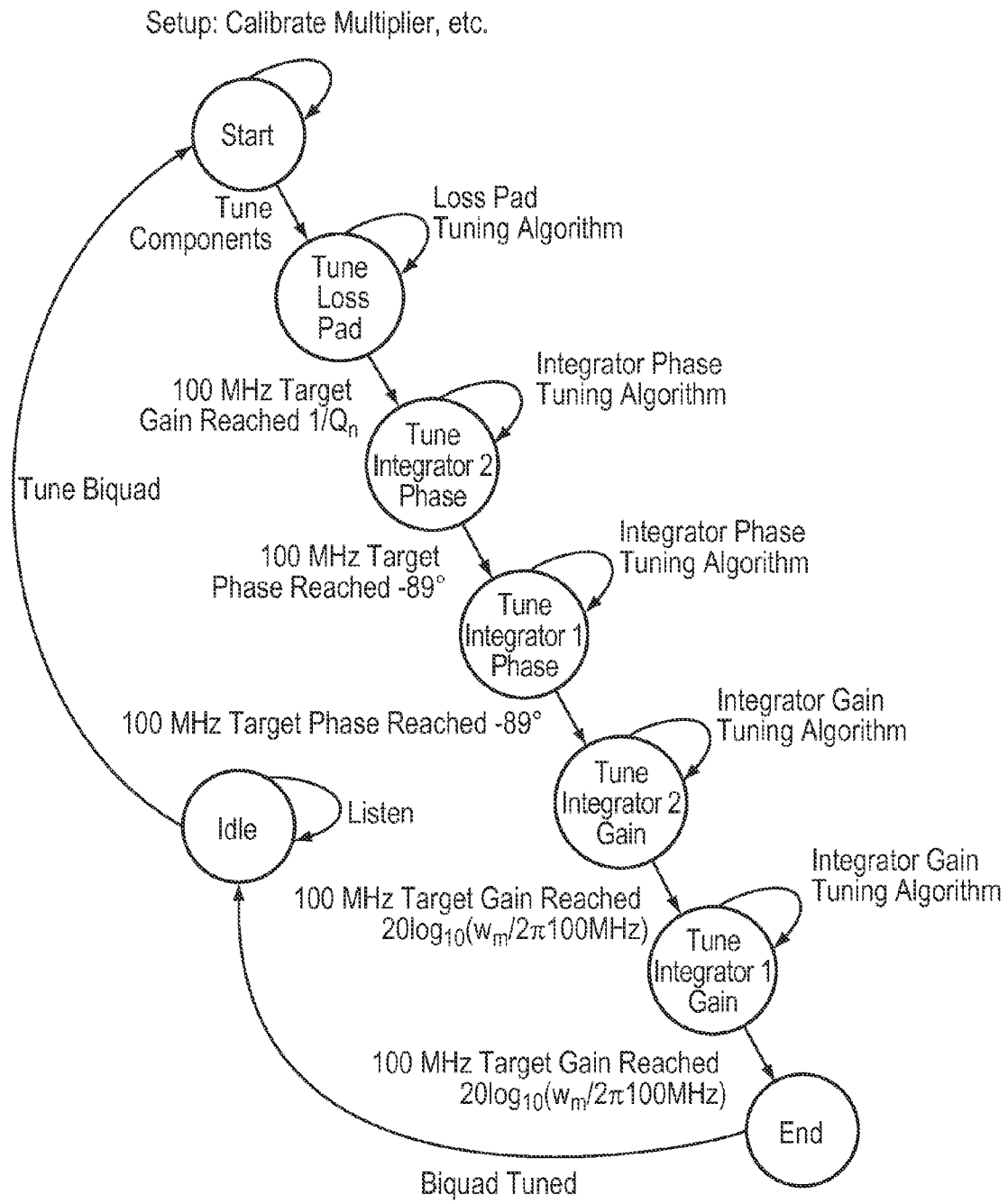
FIG. 6 is a state diagram of a process of tuning a state variable filter.

FIG. 6 is a state diagram of a process of tuning a biquad circuit for configuration as an example $8^{th}$ order bandpass filter. This procedure may be carried out successively for each of the 4 biquads connected in series, which comprise the filter. A similar procedure, in which biquad subcomponents such as loss pads and integrators are tuned for phase, and/or gain precision, can be performed for other filters. The procedure may be as follows:
 1) Set $L_n = k_n/Q_n$
 2) Set $G_1 = G_2 = w_{r_n}$ 3) Set $a_1 = \frac{1}{Q_n}$ 4) Determine target Gain at 100 MHz from:

$$G_{100\ MHz} = 20 \log_{10} \frac{w_{r_n}}{2\pi(100\ \text{MHz})}$$

5) Set target Phase at 100 MHz to $-89°$
 6) Setup: Calibrate Multiplier and other components.
 7) Tune Loss Pad controlling $a_1$
 8) Tune Integrator 2 Phase
 9) Tune Integrator 1 Phase
 10) Tune Integrator 2 Gain
 11) Tune Integrator 1 Gain A detailed procedure for completing steps 7-11 (i.e., tuning the loss pad and the phase/gain of integrators 1 and 2) is described in further detail below with reference to FIGS. 7-11.

Figure 7A:
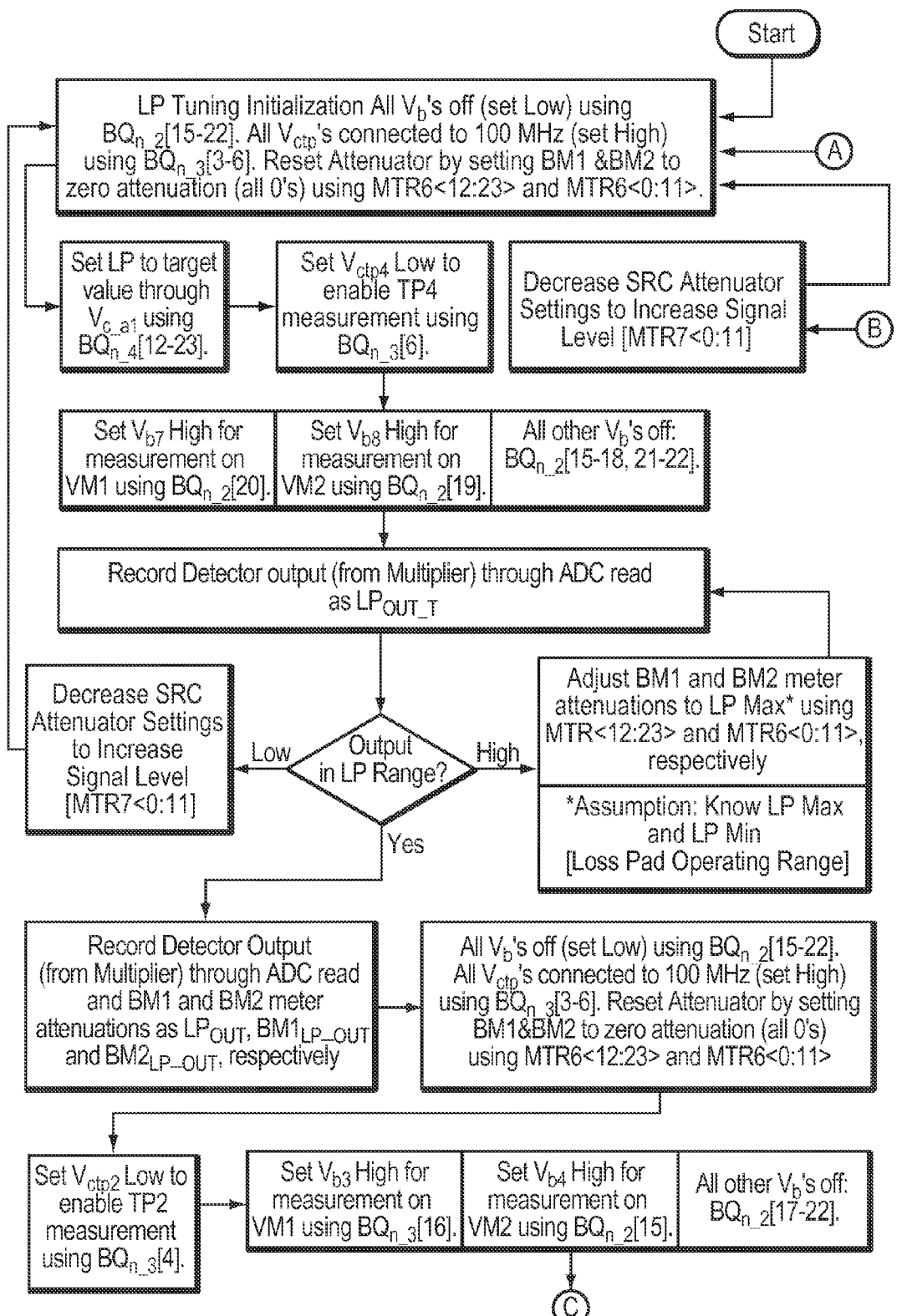
FIGS. 7A-B (collectively referred to as FIG. 7) are flow diagrams of a process of tuning a loss pad.
Figures 7, 7B:
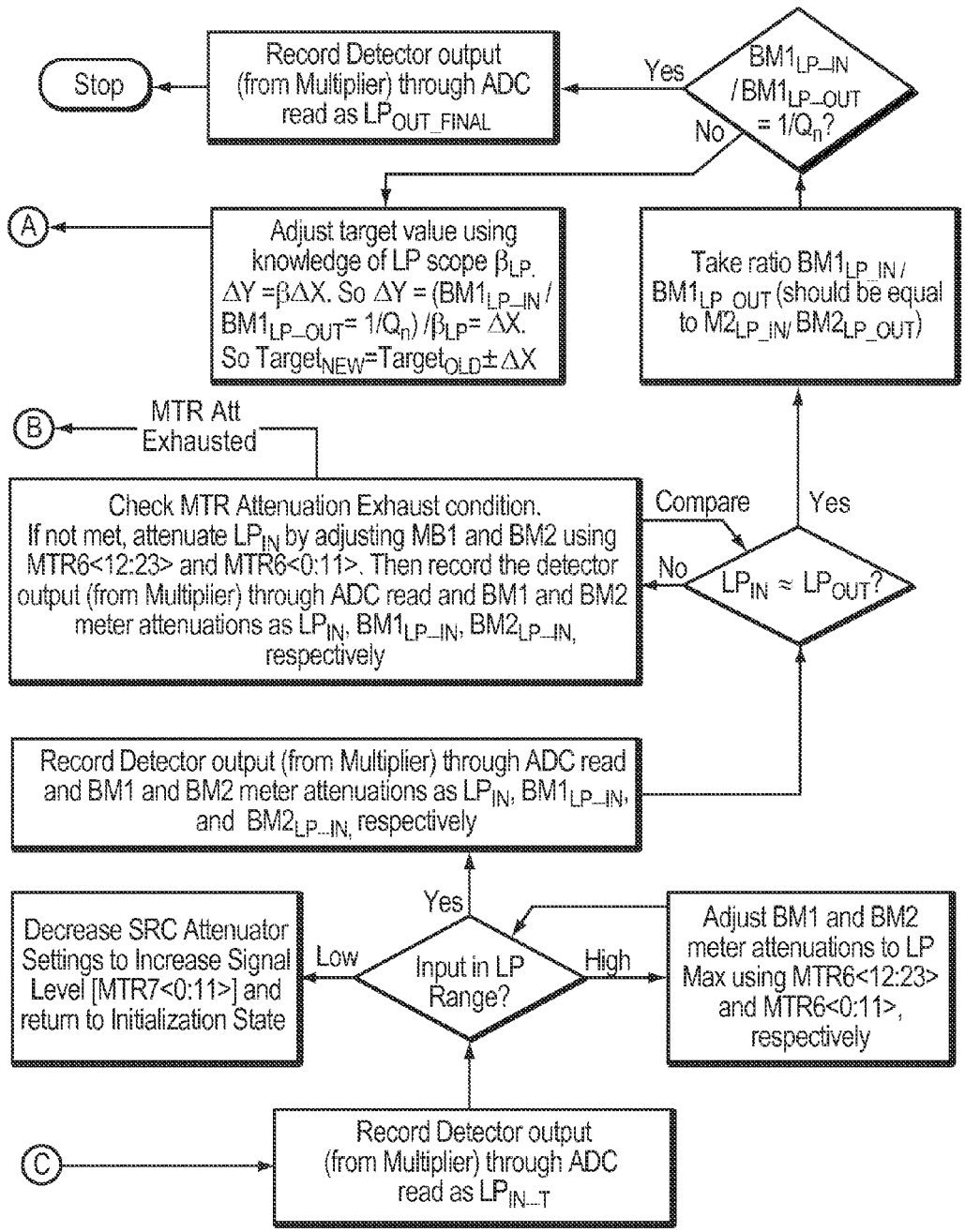

FIG. 7 is a flow diagram of a process of tuning a loss pad as in the filter tuning procedure of FIG. 6. Tune the loss pad controlling $a_1$ as follows:
 1) LP Tuning Initialization: All $V_b$'s off (set Low) using $BQ_{n\_2}[15-22]$. All $V_c$'s connected to 100 MHz (set High) using $BQ_{n\_3}[3-6]$. Reset Attenuator by setting BM1 &BM2 to zero attenuation (all 0's) using MTR6<12:23> and MTR6<0:11>.

2) Set LP to target value through Vc_a1 using BQn_4[12-23].
 3) Set Vctp4 Low to enable TP4 measurement using BQn_3[6].
 4) Set Vb7 High for measurement on VM1 using BQn_2 [20].
 5) Set Vb8 High for measurement on VM2 using BQn_2 [19].
 6) All other Vb's off: BQn_2[15-18,21-22].
 7) Record Detector output (from Multiplier) through ADC read as LPOUT_T.
 8) Adjust according to output, if needed. If low: Decrease SRC Attenuator Settings to Increase Signal Level [MTR7<0:11>]. If high, Adjust BM1 and BM2 meter attenuations to LP Max* using MTR6<12:23> and MTR6<0:11>, respectively.
 9) Record Detector Output (from Multiplier) through ADC read and BM1 and BM2 meter attenuations as $LP_{OUT}$, $BM1_{LP\_OUT}$, and $BM2_{LP\_OUT}$, respectively.
 10) All $V_b$'s off (set Low) using $BQ_{n\_2}[15-22]$. All $V_{ctp}$'s connected to 100 MHz (set High) using $BQ_{n\_3}[3-6]$. Reset Attenuator by setting BM1 &BM2 to zero attenuation (all 0's) using MTR6<12:23> and MTR6<0:11>.
 11) Set $V_{ctp2}$ Low to enable TP2 measurement using $BQ_{n\_3}[4]$.
 12) Set $V_{b3}$ High for measurement on VM1 using $BQ_{n\_2}[16]$.
 13) Set $V_{b4}$ High for measurement on VM2 using $BQ_{n\_2}[15]$.
 14) All other $V_b$'s off: $BQ_{n\_2}[17-22]$.
 15) Record Detector output (from Multiplier) through ADC read as $LP_{IN\_T}$.
 16) Adjust according to input measurement, if needed. If high, adjust BM1 and BM2 meter attenuations to LP Max using MTR6<12:23> and MTR6<0:11>, respectively. If low, decrease SRC Attenuator Settings to Increase Signal Level [MTR7<0:11>] and return to Initialization State.
 17) Record Detector Output (from Multiplier) through ADC read and BM1 and BM2 meter attenuations as $LP_{IN}$, $BM1_{LP\_IN}$, and $BM2_{LP\_IN}$, respectively
 18) $LP_{IN} \approx LP_{OUT}$? If not, check MTR Attenuation exhaust condition. If not met, attenuate $LP_{IN}$ by adjusting BM1 and BM2 using MTR6<12:23> and MTR6<0:11>. Then record the detector output (from Multiplier) through ADC read and BM1 and BM2 meter attenuations as $LP_{IN}$, $BM1_{LP\_IN}$, and $BM2_{LP\_IN}$, respectively. Compare and adjust further until $LP_{IN} \approx LP_{OUT}$.
 19) Take ratio: $BM1_{LP\_IN}/BM1_{LP\_OUT}$ (should be equal to $BM2_{LP\_IN}/BM2_{LP\_OUT}$).
 20) $BM1_{LP\_IN}/BM1_{LP\_OUT} = 1/Q_n$? If not: Adjust target value using knowledge of LP slope $\beta_{LP}$. $\Delta Y = \beta \Delta X$. So $\Delta Y = (BM1_{LP\_IN}/BM1_{LP\_OUT} - 1/Q_n)/\beta_{LP} = \Delta X$. So $Target_{NEW} = Target_{OLD} \pm \Delta X$. Repeat procedure from step (1) until $BM1_{LP\_IN}/BM1_{LP\_OUT} = 1/Q_n$.
 21) Record Detector output (from Multiplier) through ADC read as $LP_{OUT\_Final}$.

Figure 8A:
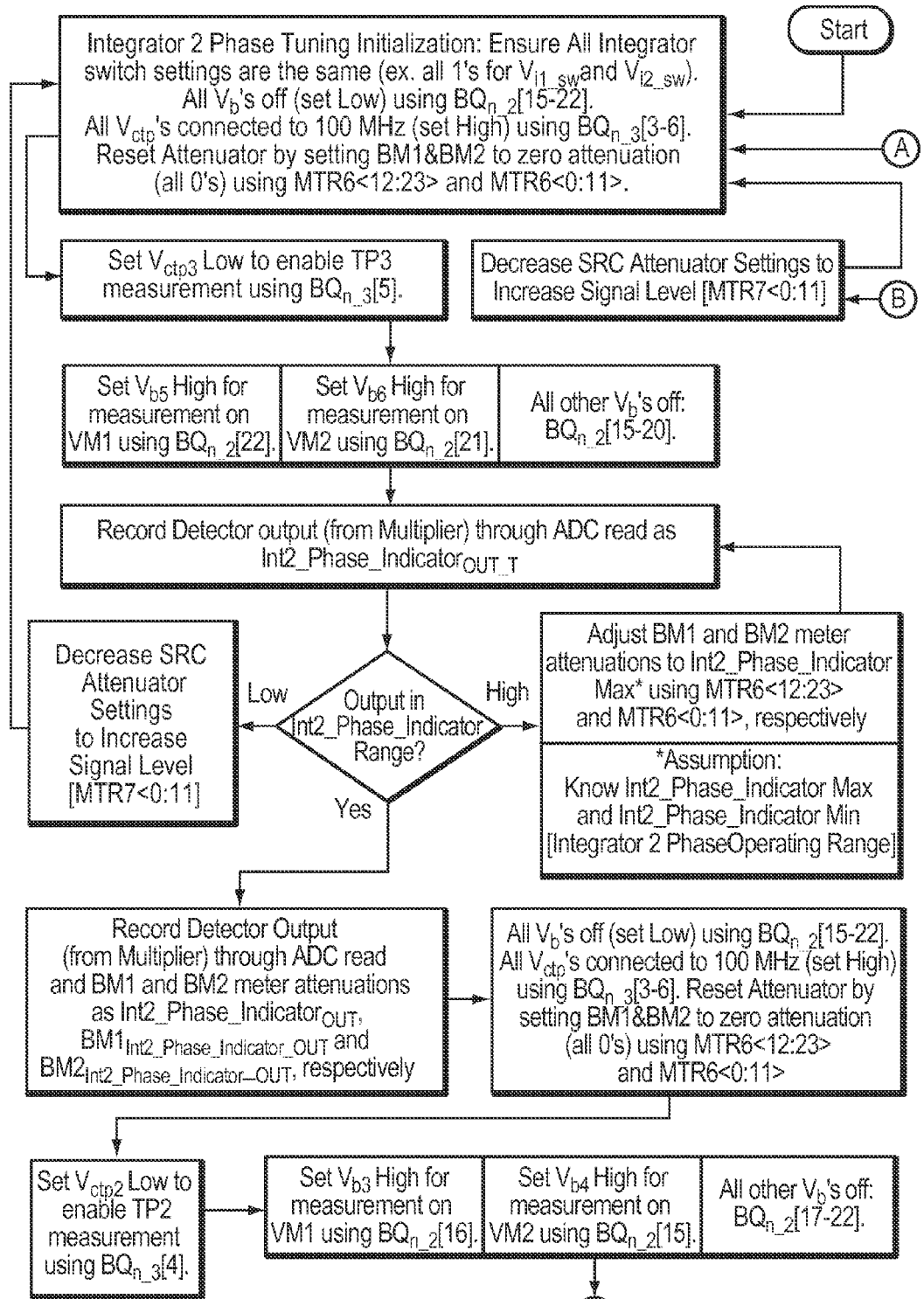
FIGS. 8A-C (collectively referred to as FIG. 8) are flow diagrams of a process of tuning an integrator phase.
Figures 8, 8B:
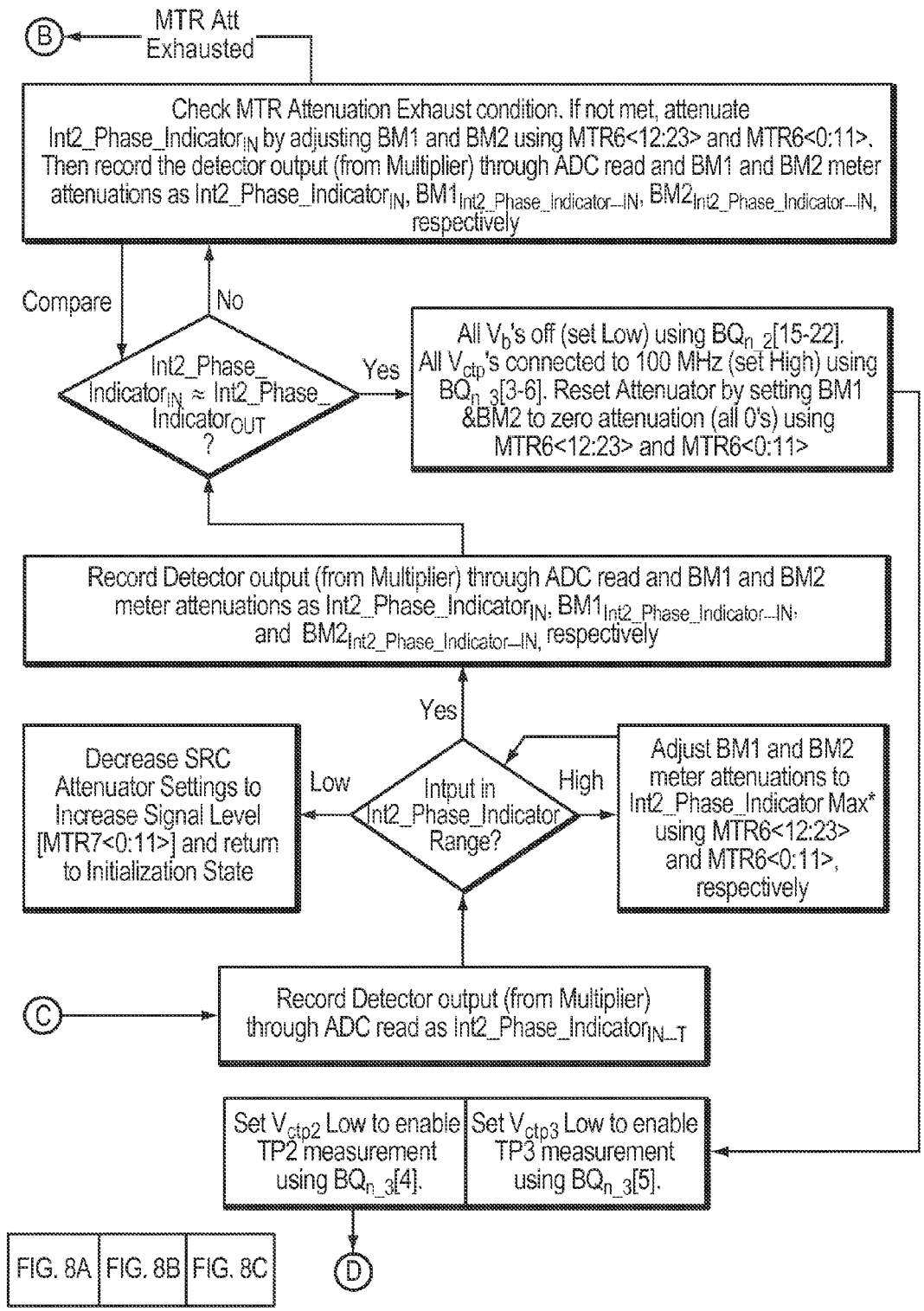
Figure 8C:
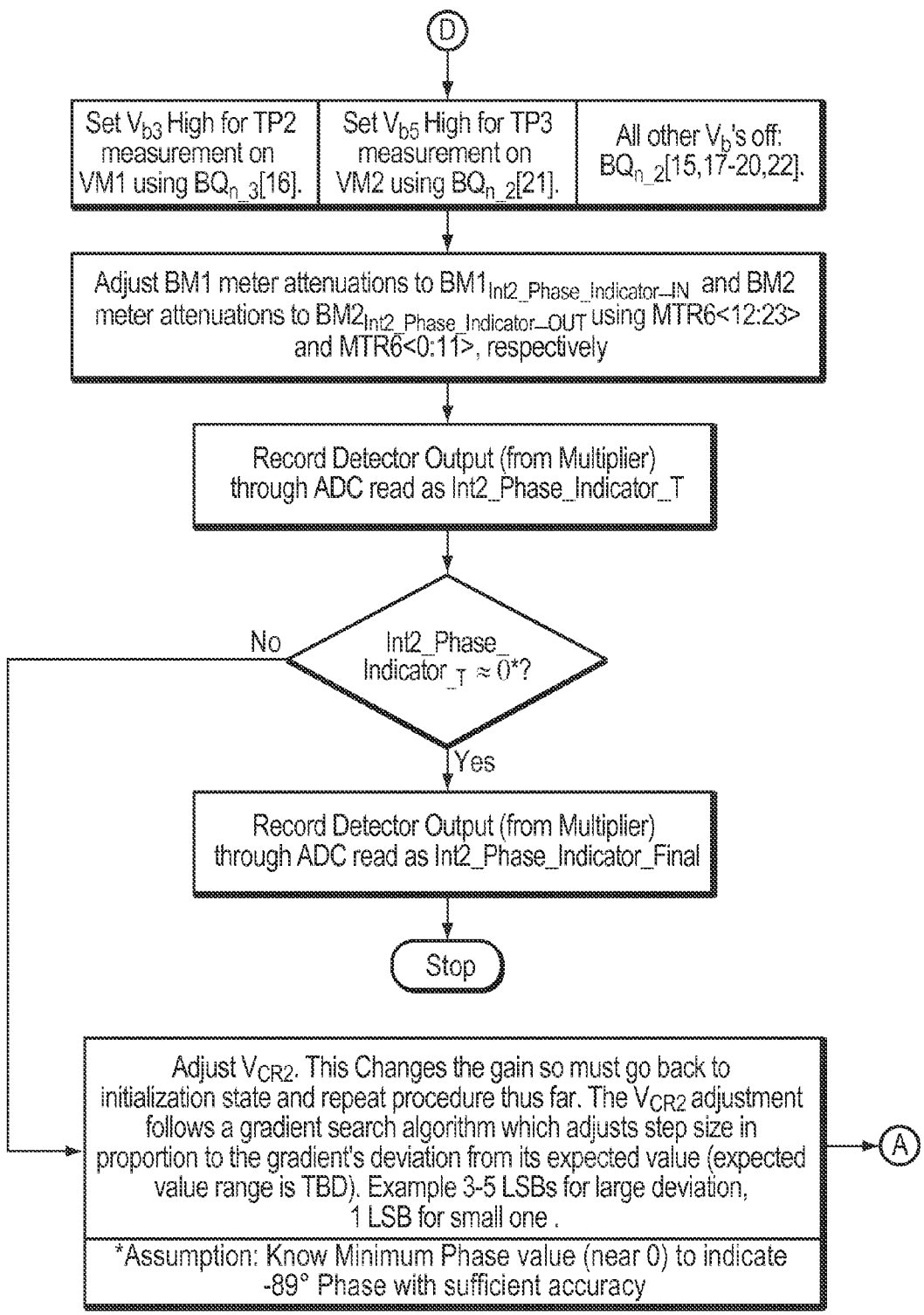

FIG. 8 is a flow diagram of a process of tuning the phase of integrator 2 as in the filter tuning procedure of FIG. 6. Tune Integrator 2 Phase as follows:
 1) Integrator 2 Phase Tuning Initialization: Ensure all integrator switch settings are the same (ex. all 1's for Vi1_sw and Vi2_sw). All Vb's off (set Low) using BQn_2[15-22]. All Vctp's connected to 100 MHz (set High) using BQn_3[3-6]. Reset Attenuator by setting BM1 &BM2 to zero attenuation (all 0's) using MTR6<12:23> and MTR6<0:11>.
 2) Set Vctp3 Low to enable TP3 measurement using BQn_3[5].

3) Set Vb5 High for measurement on VM1 using BQn_2 [22].

4) Set Vb6 High for measurement on VM2 using BQn_2 [21].

5) All other Vb's off: BQn_2[15-20].

6) Record Detector output (from Multiplier) through ADC read as Int2_Phase IndicatorOUT_T.

7) Output in Int2_Phase_Indicator Range? If high: Adjust BM1 and BM2 meter attenuations to Int2_Phase_Indicator Max* using MTR6<12:23> and MTR6<0:11>, respectively. If low, Decrease SRC Attenuator Settings to Increase Signal Level [MTR7<0:11>].

8) Record Detector Output (from Multiplier) through ADC read and BM1 and BM2 meter attenuations as Int2_Phase IndicatorOUT, BM1Int2_Phase_Indicator_OUT, and BM2 Int2_Phase_Indicator_OUT, respectively 9) All Vb's off (set Low) using BQn_2[15-22]. All Vctp's connected to 100 MHz (set High) using BQn_3[3-6]. Reset Attenuator by setting BM1 &BM2 to zero attenuation (all 0's) using MTR6<12:23> and MTR6<0:11>.

10) Set Vctp2 Low to enable TP2 measurement using BQn_3[4].

11) Set Vb3 High for measurement on VM1 using BQn_2 [16].

12) Set Vb4 High for measurement on VM2 using BQn_2 [15].

13) All other Vb's off: BQn_2[17-22].

14) Record Detector output (from Multiplier) through ADC read as Int2_Phase_IndicatorIN_T.

15) Input in Int2_Phase_Indicator Range? If low: Decrease SRC Attenuator Settings to Increase Signal Level [MTR7<0:11>] and return to Initialization State. If high: Adjust BM1 and BM2 meter attenuations to Int2_Phase_Indicator Max* using MTR6<12:23> and MTR6<0:11>, respectively.

16) Record Detector Output (from Multiplier) through ADC read and BM1 and BM2 meter attenuations as Int2_Phase_IndicatorIN, BM1Int2_Phase_Indicator_IN, and BM2 Int2_Phase_Indicator_IN, respectively.

17) Int2_Phase_IndicatorIN≈Int2_Phase_IndicatorOUT? If no: Check MTR Attenuation exhaust condition. If not met, attenuate Int2_Phase_IndicatorIN by adjusting BM1 and BM2 using MTR6<12:23> and MTR6<0:11>. Then record the detector output (from Multiplier) through ADC read and BM1 and BM2 meter attenuations as Int2_Phase_IndicatorIN, BM1Int2_Phase_Indicator_IN, and BM2 Int2_Phase_Indicator_IN, respectively. Decrease SRC Attenuator Settings to Increase Signal Level [MTR7<0: 11>]. Repeat procedure from step (1).

18) All Vb's off (set Low) using BQn_2[15-22]. All Vctp's connected to 100 MHz (set High) using BQn_3[3-6]. Reset Attenuator by setting BM1 &BM2 to zero attenuation (all 0's) using MTR6<12:23> and MTR6<0:11>.

19) Set Vctp2 Low to enable TP2 measurement using BQn_3[4].

20) Set Vctp3 Low to enable TP3 measurement using BQn_3[5].

21) Set Vb3 High for TP2 measurement on VM1 using BQn_2[16].

22) Set Vb6 High for TP3 measurement on VM2 BQn_2 [21].

23) All other Vb's off: BQn_2[15,17-20,22].

24) Adjust BM1 meter attenuation to BM1Int2_Phase_Indicator_IN and BM2 meter attenuation to BM2 Int2_Phase_Indicator_OUT using MTR6<12:23> and MTR6<0:11>, respectively.

25) Record Detector Output (from Multiplier) through ADC read as Int2_Phase_Indicator_T.

26) Int2_Phase_Indicator_T≈0*? If no: Adjust VCR2. This changes the gain, so must go back to Initialization state and repeat procedure thus far. The VCR2 adjustment follows a gradient search algorithm which adjusts step size in proportion to the gradient's deviation from its expected value (expected value range is TBD). Example: 3-5 LSBs for large deviation, 1 LSB for small one. Repeat process from step (1).

27) Record Detector Output (from Multiplier) through ADC read as Int2_Phase_Indicator_Final.

Figure 9A:
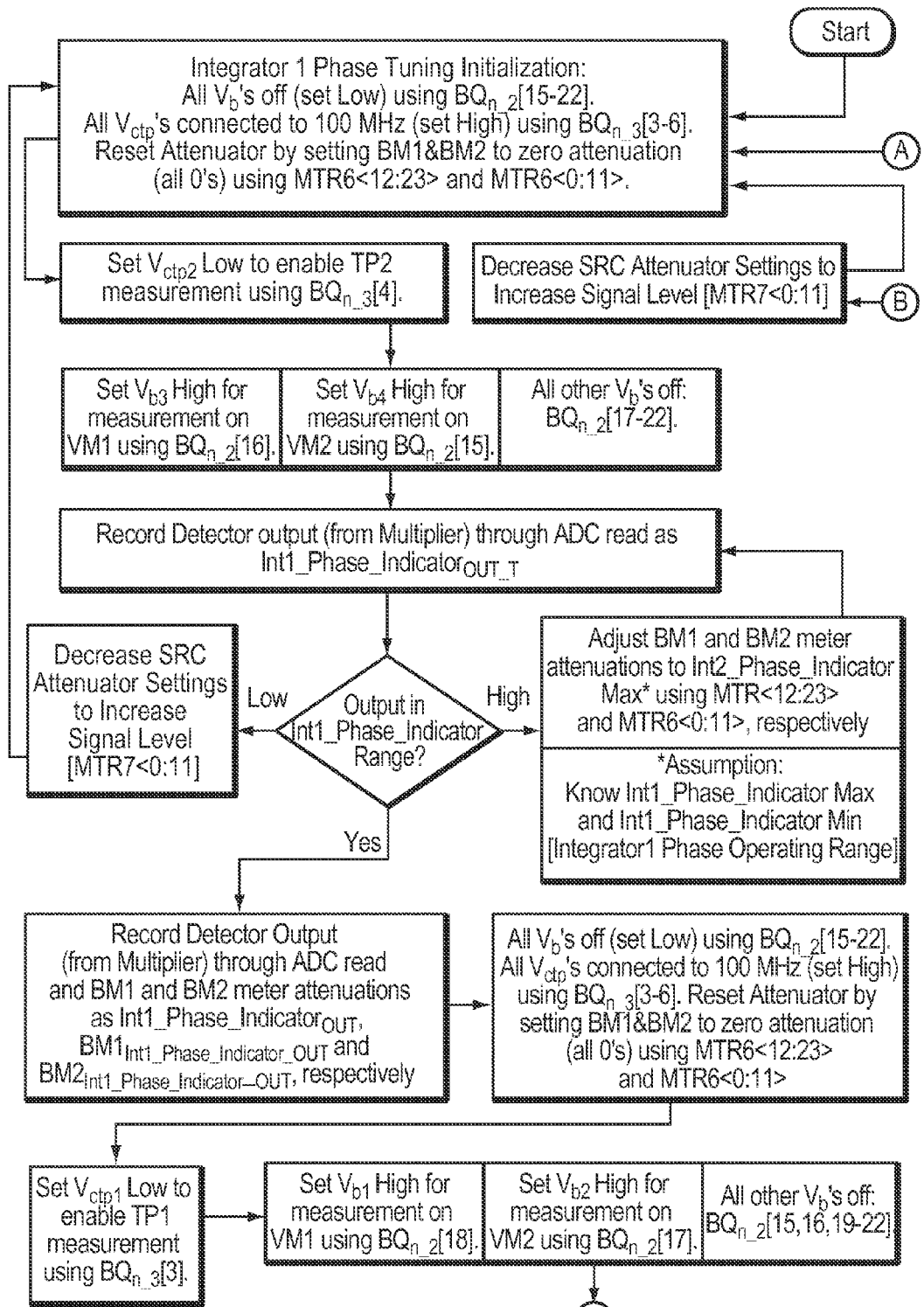
FIGS. 9A-C (collectively referred to as FIG. 9) are flow diagrams of a process of tuning a phase of an additional integrator.
Figure 9B:
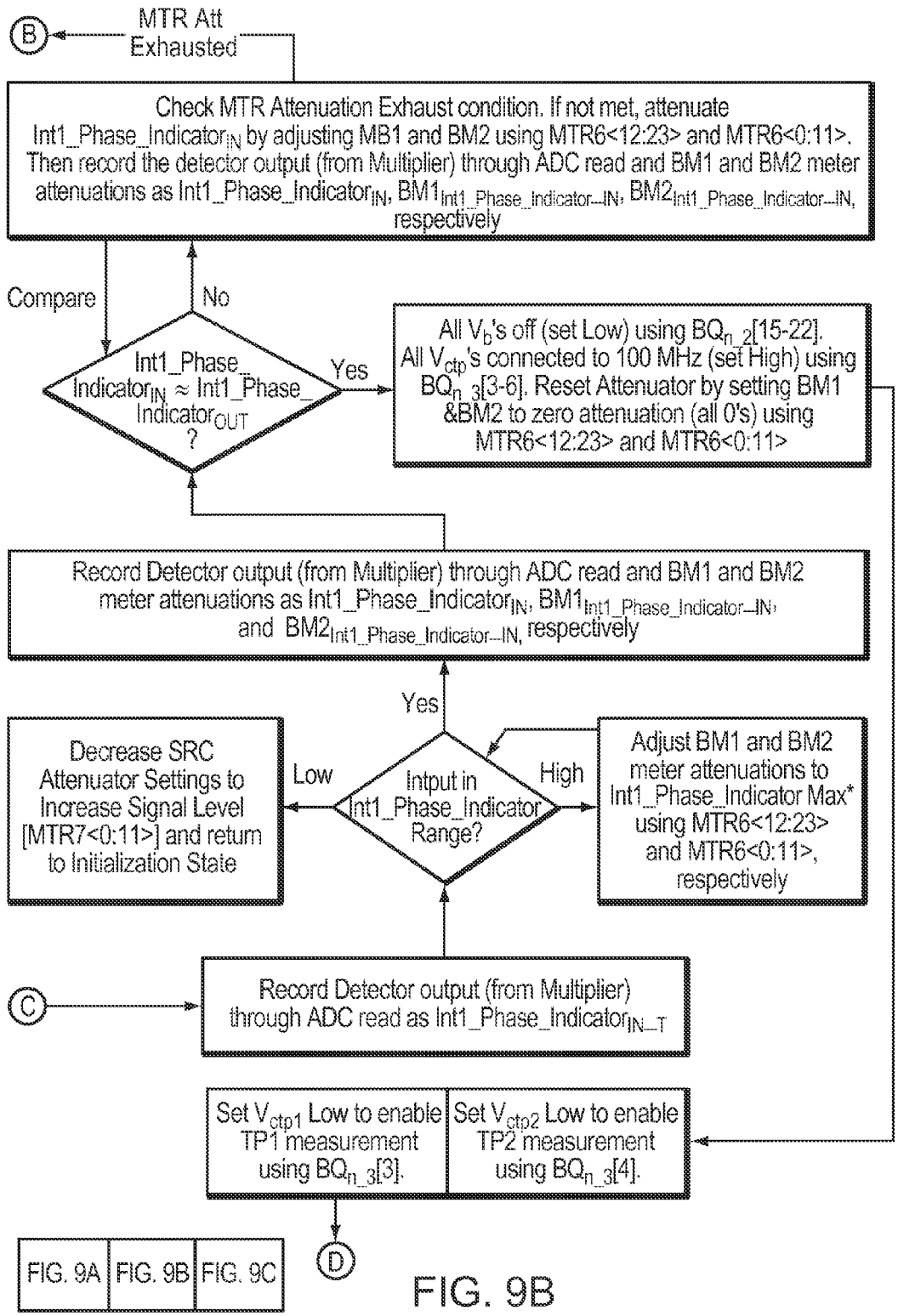
Figure 9C:
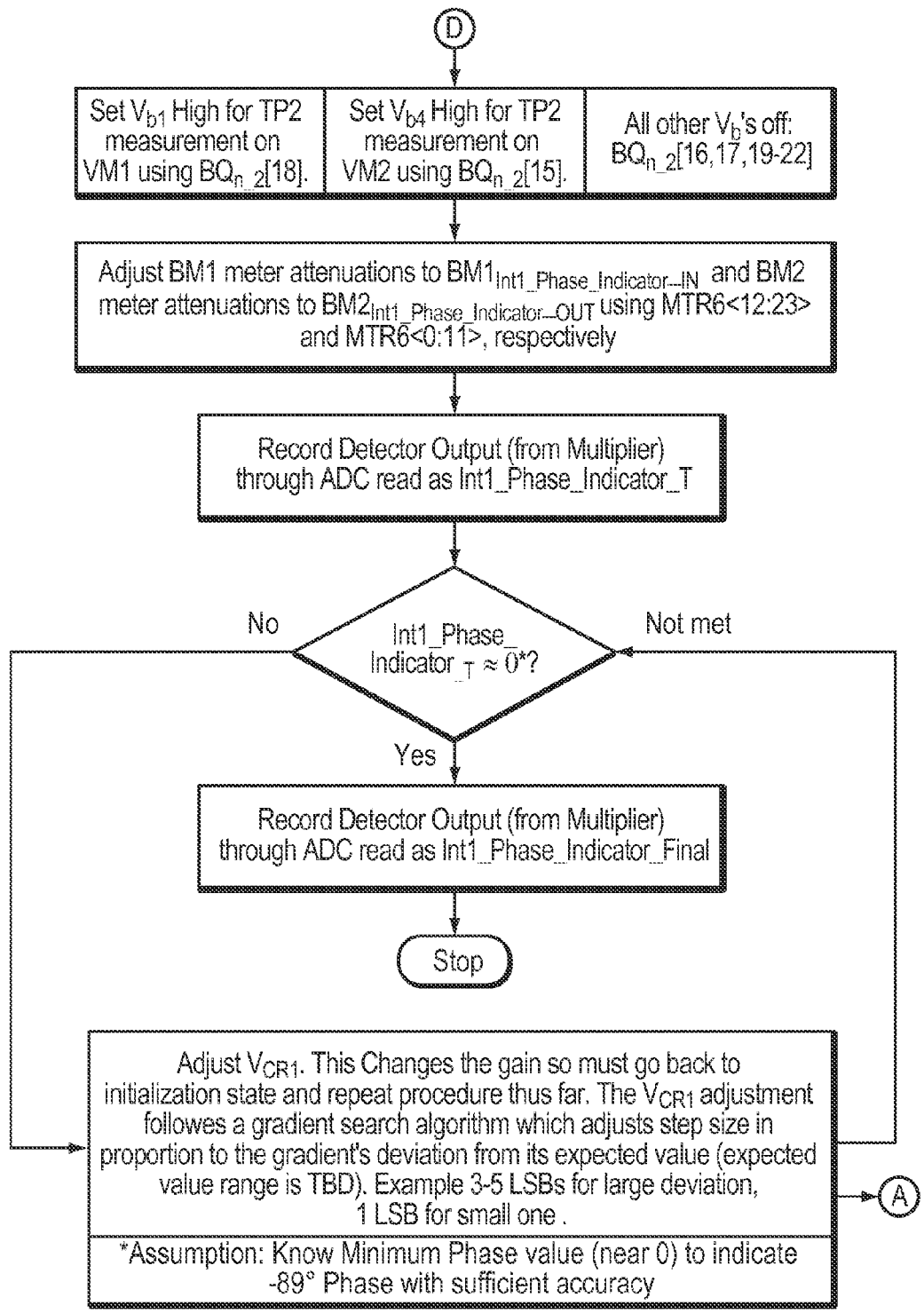

FIG. 9 is a flow diagram of a process of tuning a phase of integrator 1 as in the filter tuning procedure of FIG. 6.

Tune Integrator 1 Phase as follows:

1) Integrator 1 Phase Tuning Initialization: All Vb's off (set Low) using BQn_2[15-22]. All Vctp's connected to 100 MHz (set High) using BQn_3[3-6]. Reset Attenuator by setting BM1 &BM2 to zero attenuation (all 0's) using MTR6<12: 23> and MTR6<0:11>.

2) Set Vctp2 Low to enable TP2 measurement using BQn_3[4].

3) Set Vb3 High for measurement on VM1 using BQn_2 [16]. Set Vb4 High for measurement on VM2 using BQn_2 [15]. All other Vb's off: BQn_2[17-22].

4) Record Detector output (from Multiplier) through ADC read as Int1_Phase_IndicatorOUT_T.

5) Output in Int1_Phase_Indicator Range? If high: Adjust BM1 and BM2 meter attenuations to Int1_Phase_Indicator Max* using MTR6<12:23> and MTR6<0:11>, respectively. If low, Decrease SRC Attenuator Settings to Increase Signal Level [MTR7<0:11>], and return to (1).

6) Record Detector Output (from Multiplier) through ADC read and BM1 and BM2 meter attenuations as Int1_Phase_IndicatorOUT, BM1Int1_Phase_Indicator_OUT, and BM2 Int1_Phase_Indicator_OUT, respectively.

7) All Vb's off (set Low) using BQn_2[15-22]. All Vctp's connected to 100 MHz (set High) using BQn_3[3-6]. Reset Attenuator by setting BM1 &BM2 to zero attenuation (all 0's) using MTR6<12:23> and MTR6<0:11>.

8) Set Vctp1 Low to enable TP1 measurement using BQn_3[3].

9) Set Vb1 High for measurement on VM1 using BQn_2 [18]. Set Vb2 High for measurement on VM2 using BQn_2 [17]. All other Vb's off: BQn_2[15,16,19-22].

10) Record Detector output (from Multiplier) through ADC read as Int1_Phase_IndicatorIN_T.

11) Input in Int1_Phase_Indicator Range? If high: Adjust BM1 and BM2 meter attenuations to Int1_Phase_Indicator Max* using MTR6<12:23> and MTR6<0:11>, respectively; retry. If low: Decrease SRC Attenuator Settings to Increase Signal Level [MTR7<0:11>] and return to Initialization State.

12) Record Detector Output (from Multiplier) through ADC read and BM1 and BM2 meter attenuations as Int1_Phase_IndicatorIN, BM1Int1_Phase_Indicator_IN, and BM2 Int1_Phase_Indicator_IN, respectively.

13) Int1_Phase_IndicatorIN≈Int1_Phase_IndicatorOUT? If no: Check MTR Attenuation exhaust condition. If not met, attenuate Int1_Phase_IndicatorIN by adjusting BM1 and BM2 using MTR6<12:23> and MTR6<0:11>. Then record the detector output (from Multiplier) through ADC read and BM1 and BM2 meter attenuations as Int1_Phase_IndicatorIN, BM1Int1_Phase_Indicator_IN, and BM2 Int1_Phase_Indicator_IN, respectively. Decrease SRC Attenuator Settings to Increase Signal Level [MTR7<0: 11>]. Return to (1).

14) All Vb's off (set Low) using BQn_2[15-22]. All Vctp's connected to 100 MHz (set High) using BQn_3[3-6]. Reset Attenuator by setting BM1 &BM2 to zero attenuation (all 0's) using MTR6<12:23> and MTR6<0:11>.

15) Set Vctp1 Low to enable TP1 measurement using BQn_3[3]. Set Vctp2 Low to enable TP2 measurement using BQn_3[4].

16) Set Vb1 High for TP2 measurement on VM1 using BQn_2[18]. Set Vb4 High for TP2 measurement on VM2 BQn_2[15]. All other Vb's off: BQn_2[16,17,19-22].

17) Adjust BM1 meter attenuation to BM1Int1_Phase_Indicator_IN and BM2 meter attenuation to BM2 Int1_Phase_Indicator_OUT using MTR6<12:23> and MTR6<0:11>, respectively.

18) Record Detector Output (from Multiplier) through ADC read as Int1_Phase_Indicator_T.

19) Int1_Phase_Indicator_T≈0*? If no: Adjust VCR1. This changes the gain, so must go back to Initialization state and repeat procedure thus far. The VCR1 adjustment follows a gradient search algorithm which adjusts step size in proportion to the gradient's deviation from its expected value (expected value range is TBD). Example: 3-5 LSBs for large deviation, 1 LSB for small one. Return to (1).

20) Record Detector Output (from Multiplier) through ADC read as Int1_Phase_Indicator_Final.

Figures 10, 10A:
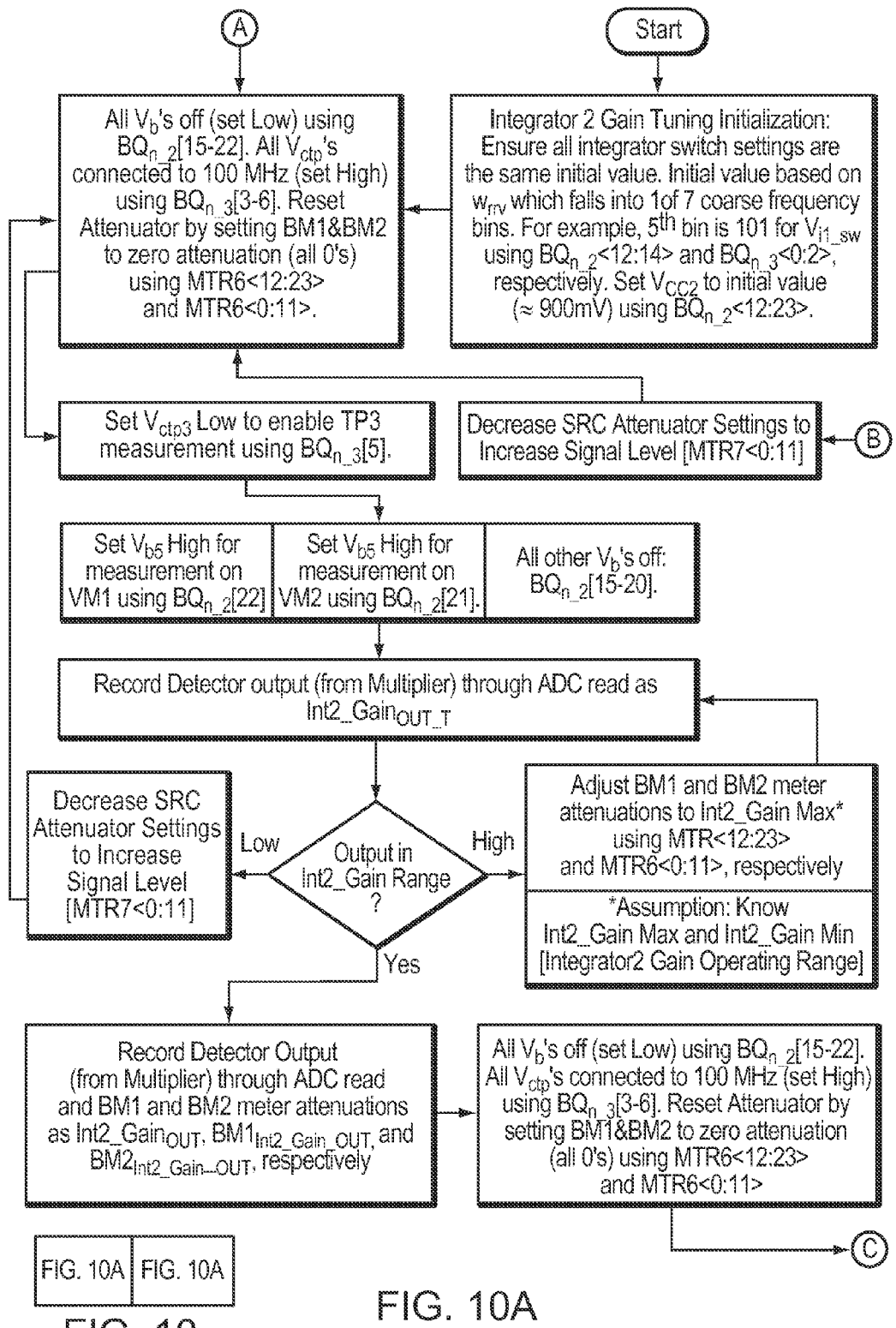
FIGS. 10A-B (collectively referred to as FIG. 10) are flow diagrams of a process of tuning an integrator gain.
Figure 10B:
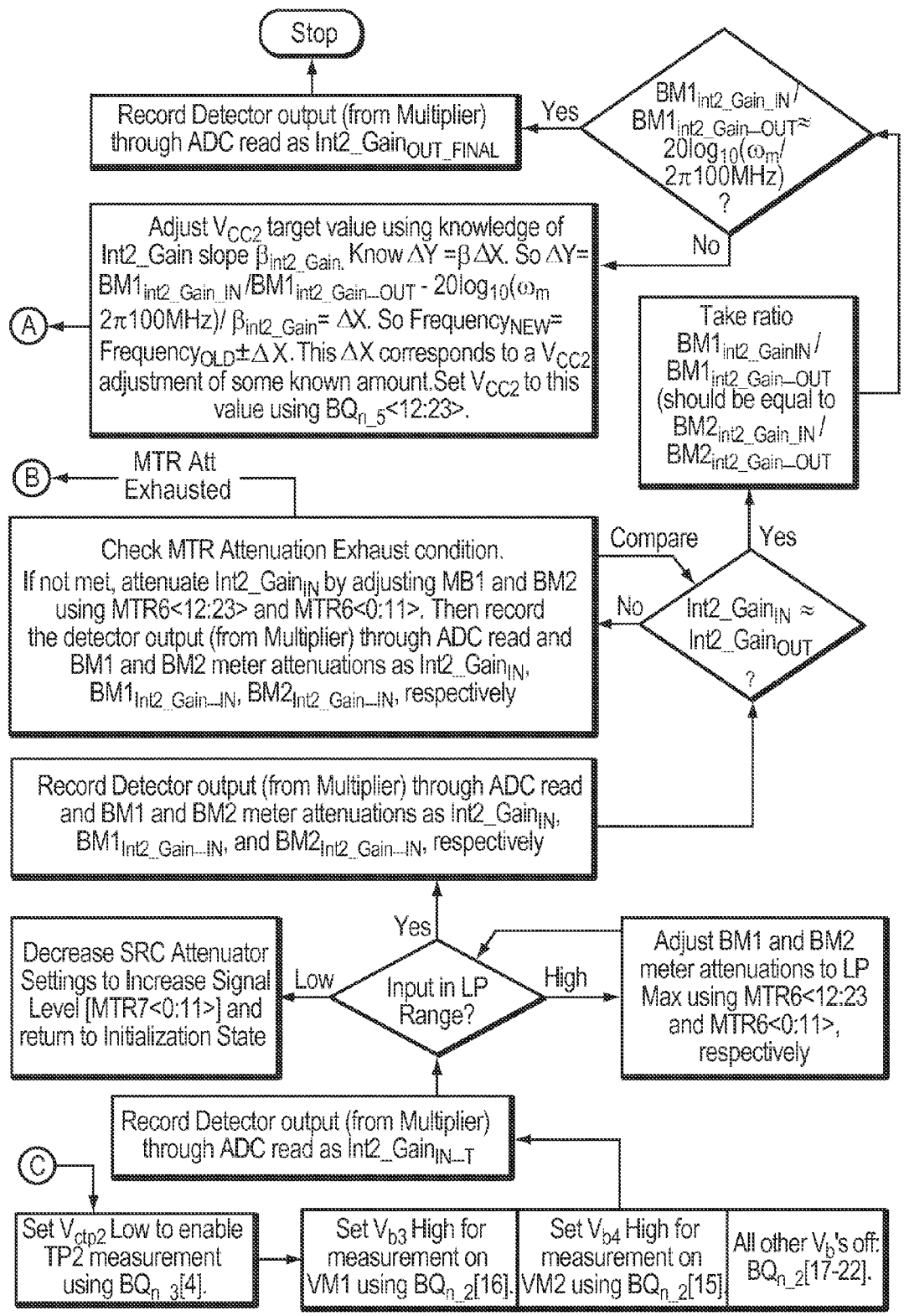

FIG. 10 is a flow diagram of a process of tuning the gain of integrator 2 as in the filter tuning procedure of FIG. 6.

Tune Integrator 2 Gain as follows:

1) Integrator 2 Gain Tuning Initialization: Ensure all integrator switch settings are the same initial value. Initial value based on wrn, which falls into 1 of 7 coarse frequency bins. For example, 5th bin is 101 for Vi1_sw and Vi2_sw using BQn_2<12:14> and BQn_3<0:2>, respectively. Set VCC2 to initial value (≈900 mV) using BQn_5<12:23>.

2) All Vb's off (set Low) using BQn_2[15-22]. All Vctp's connected to 100 MHz (set High) using BQn_3[3-6]. Reset Attenuator by setting BM1 &BM2 to zero attenuation (all 0's) using MTR6<12:23> and MTR6<0:11>.

3) Set Vctp3 Low to enable TP3 measurement using BQn_3[5].

4) Set Vb5 High for measurement on VM1 using BQn_2[22]. Set Vb6 High for measurement on VM2 using BQn_2[21]. All other Vb's off: BQn_2[15-20].

5) Record Detector output (from Multiplier) through ADC read as Int2_GainOUT_T.

6) Output in Int2_Gain Range? If low: Decrease SRC Attenuator Settings to Increase Signal Level [MTR7<0:11>]; return to (2). If high: Adjust BM1 and BM2 meter attenuations to Int2_Gain Max* using MTR6<12:23> and MTR6<0:11>, respectively; retry.

7) Record Detector Output (from Multiplier) through ADC read and BM1 and BM2 meter attenuations as Int2_GainOUT,BM1Int2_Gain_OUT, and BM2 Int2_Gain_OUT, respectively.

8) All Vb's off (set Low) using BQn_2[15-22]. All Vctp's connected to 100 MHz (set High) using BQn_3[3-6]. Reset Attenuator by setting BM1 &BM2 to zero attenuation (all 0's) using MTR6<12:23> and MTR6<0:11>.

9) Set Vctp2 Low to enable TP2 measurement using BQn_3[4].

10) Set Vb3 High for measurement on VM1 using BQn_2[16]. Set Vb4 High for measurement on VM2 using BQn_2[15]. All other Vb's off: BQn_2[17-22].

11) Record Detector output (from Multiplier) through ADC read as Int2_GainIN_T.

12) Input in Int2_Gain Range? If low: Decrease SRC Attenuator Settings to Increase Signal Level [MTR7<0:11>] and return to Initialization State. If high: Adjust BM1 and BM2 meter attenuations to Int2_Gain Max using MTR6<12:23> and MTR6<0:11>, respectively; retry.

13) Record Detector Output (from Multiplier) through ADC read and BM1 and BM2 meter attenuations as Int2_GainIN, BM1Int2_Gain_IN, and BM2 Int2_Gain_IN, respectively.

14) Int2_GainIN≈Int2_GainOUT? If no: Check MTR Attenuation exhaust condition. If not met, attenuate Int2_GainIN by adjusting BM1 and BM2 using MTR6<12:23> and MTR6<0:11>. Then record the detector output (from Multiplier) through ADC read and BM1 and BM2 meter attenuations as Int2_GainIN, BM1Int2_Gain_IN, and BM2 Int2_Gain_IN, respectively; retry (If MRT Attn exhausted: Decrease SRC Attenuator Settings to Increase Signal Level [MTR7<0:11>]; return to (2)).

15) Take ratio: BM1Int2_Gain_IN/BM1Int2_Gain_OUT (should be equal to BM2 Int2_Gain_IN/BM2 Int2_Gain_OUT).

16) BM1Int2_Gain_IN/BM1Int2_Gain_OUT≈20 log 10(ωrn/2π100 MHz)? If no: Adjust Vcc2 target value using knowledge of Int2_Gain slope βInt2_Gain. Know ΔY=βΔX. So ΔY=(BM1Int2_Gain_IN/BM1Int2_Gain_OUT−20 log 10(ωrn/2π100 MHz))/(βInt2_Gain=ΔX. So FrequencyNEW=FrequencyOLD±ΔX. This ΔX corresponds to a Vcc2 adjustment of some known amount. Set VCC2 to this value using BQn_5<12:23>.

17) Record Detector output (from Multiplier) through ADC read as Int2_GainOUT_Final.

Figure 11A:
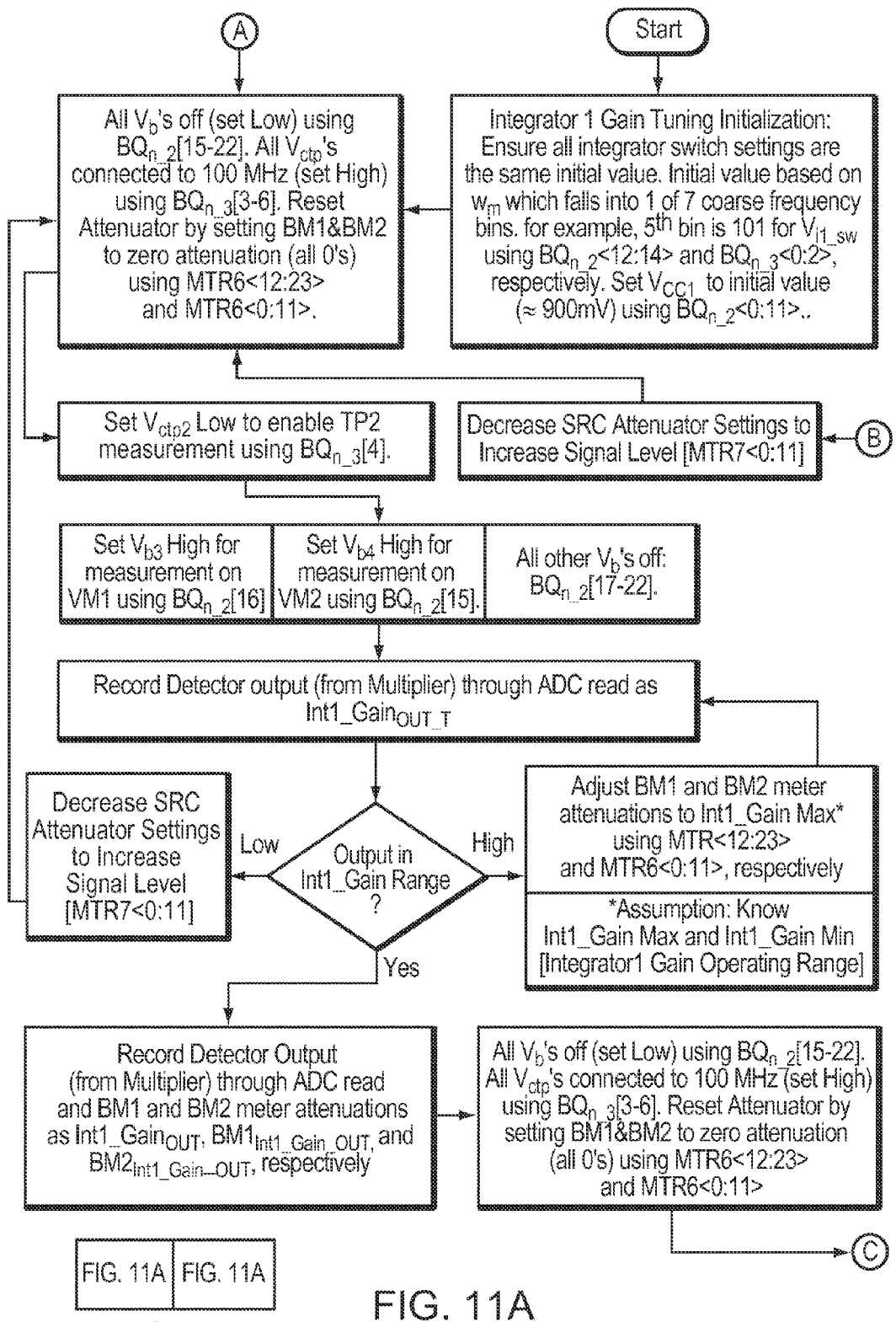
FIGS. 11A-B (collectively referred to as FIG. 11) are flow diagrams of a process of tuning a gain of an additional integrator.
Figure 11B:
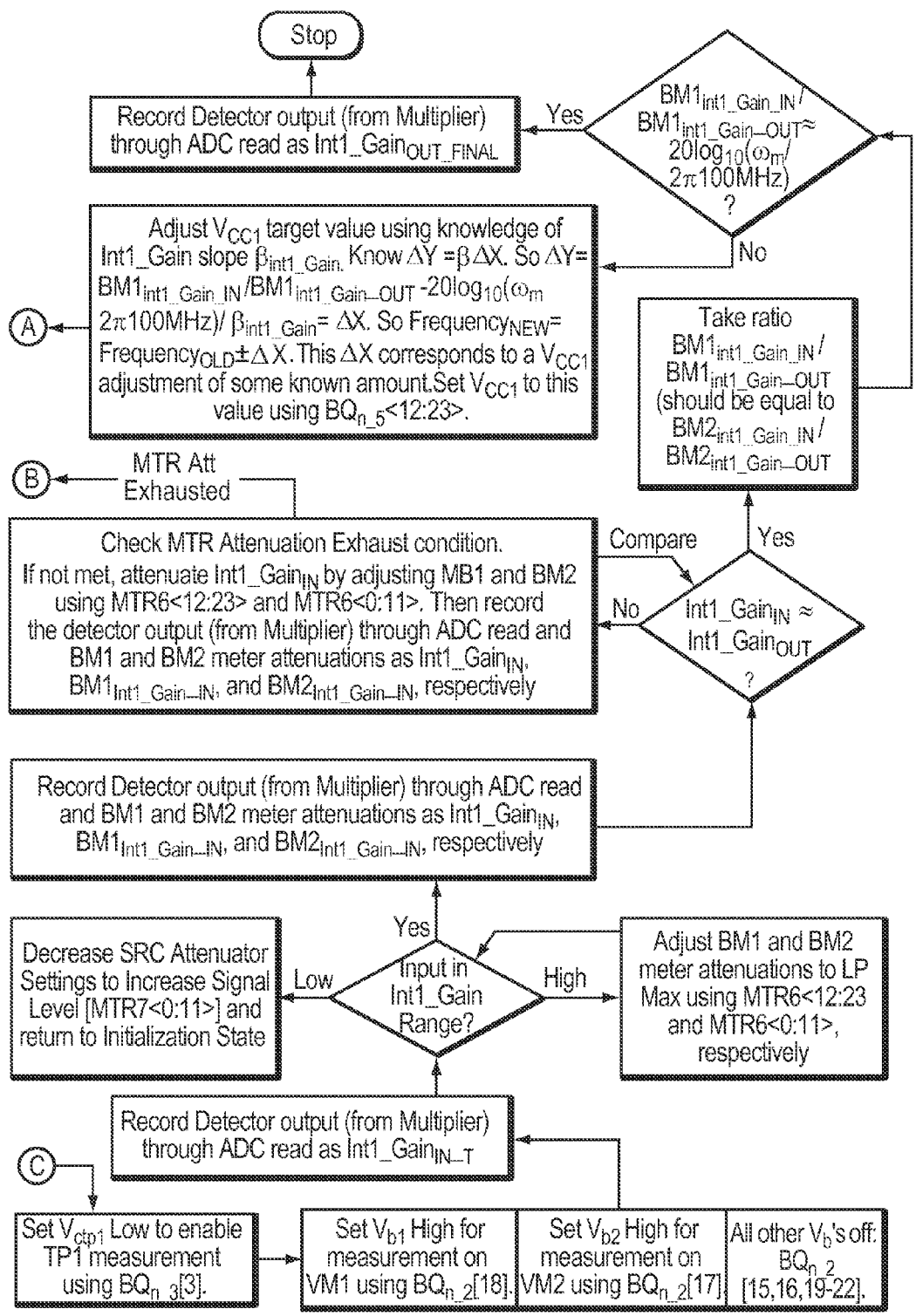

FIG. 11 is a flow diagram of a process of tuning a gain of integrator 1 as in the filter tuning procedure of FIG. 6. Tune Integrator 1 Gain as follows:

1) Integrator 1 Gain Tuning Initialization: Ensure all integrator switch settings are the same initial value. (Initial value based on wrn, which falls into 1 of 7 coarse frequency bins. For example, 5th bin is 101 for Vi1_sw and Vi2_sw using BQn_2<12:14> and BQn_3<0:2>, respectively. Set VCC1 to initial value (≈900 mV) using BQn_2<0:11>.

2) All Vb's off (set Low) using BQn_2[15-22]. All Vctp's connected to 100 MHz (set High) using BQn_3[3-6]. Reset Attenuator by setting BM1 &BM2 to zero attenuation (all 0's) using MTR6<12:23> and MTR6<0:11>.

3) Set Vctp2 Low to enable TP2 measurement using BQn_3[4].

4) Set Vb3 High for measurement on VM1 using BQn_2[16]. Set Vb4 High for measurement on VM2 using BQn_2[15]. All other Vb's off: BQn_2[17-22].

5) Record Detector output (from Multiplier) through ADC read as Int1_GainOUT_T.

6) Output in Int1_Gain Range? If low: Decrease SRC Attenuator Settings to Increase Signal Level [MTR7<0:11>]; return to (2). If high: Adjust BM1 and BM2 meter attenuations to Int1_Gain Max* using MTR6<12:23> and MTR6<0:11>, respectively; retry.

7) Record Detector Output (from Multiplier) through ADC read and BM1 and BM2 meter attenuations as Int1_GainOUT,BM1Int1_Gain_OUT, and BM2 Int1_Gain_OUT, respectively.

8) All Vb's off (set Low) using BQn_2[15-22]. All Vctp's connected to 100 MHz (set High) using BQn_3[3-6]. Reset Attenuator by setting BM1 &BM2 to zero attenuation (all 0's) using MTR6<12:23> and MTR6<0:11>.

9) Set Vctp1 Low to enable TP1 measurement using BQn_3[3].

10) Set Vb1 High for measurement on VM1 using BQn_2[18]. Set Vb2 High for measurement on VM2 using BQn_2[17]. All other Vb's off: BQn_2[15,16,19-22].

11) Record Detector output (from Multiplier) through ADC read as Int1_GainIN_T.

12) Input in Int1_Gain Range? If low: Decrease SRC Attenuator Settings to Increase Signal Level [MTR7<0:11>] and return to Initialization State. Adjust BM1 and BM2 meter attenuations to Int1_Gain Max using MTR6<12:23> and MTR6<0:11>, respectively; retry.

13) Record Detector Output (from Multiplier) through ADC read and BM1 and BM2 meter attenuations as Int1_GainIN, BM1Int1_Gain_IN, and BM2 Int1_Gain_IN, respectively.

14) Int1_GainIN≈Int1_GainOUT? If no: Check MTR Attenuation exhaust condition. If not met, attenuate Int1_GainIN by adjusting BM1 and BM2 using MTR6<12:23> and MTR6<0:11>. Then record the detector output (from Multiplier) through ADC read and BM1 and BM2 meter attenuations as Int1_GainIN, BM1Int1_Gain_IN, and BM2 Int1_Gain_IN, respectively; retry (if MTR Attn exhausted: Decrease SRC Attenuator Settings to Increase Signal Level [MTR7<0:11>]; return to (2).)

15) Take ratio: BM1Int1_Gain_IN/BM1Int1_Gain_OUT (should be equal to BM2 Int1_Gain_IN/BM2 Int1_Gain_OUT)

16) BM1Int1_Gain_IN/BM1Int1_Gain_OUT≈20 log 10 ($\omega$rn/2$\pi$100 MHz)? If no: Adjust Vcc1 target value using knowledge of Int1_Gain slope $\beta$Int1_Gain. Know $\Delta Y=13\Delta X$. So $\Delta Y=$(BM1Int1_Gain_IN/BM1Int1_Gain_OUT−20 log 10 ($\omega$rn/2$\pi$100 MHz))/$\beta$Int1_Gain=$\Delta X$. So FrequencyNEW=FrequencyOLD±$\Delta X$. This $\Delta X$ corresponds to a Vcc1 adjustment of some known amount. Set VCC1 to this value using BQn_5<12:23>.

17) Record Detector output (from Multiplier) through ADC read as Int1_GainOUT_Final.

Integrator and Loss Pad Control

Figure 12A:
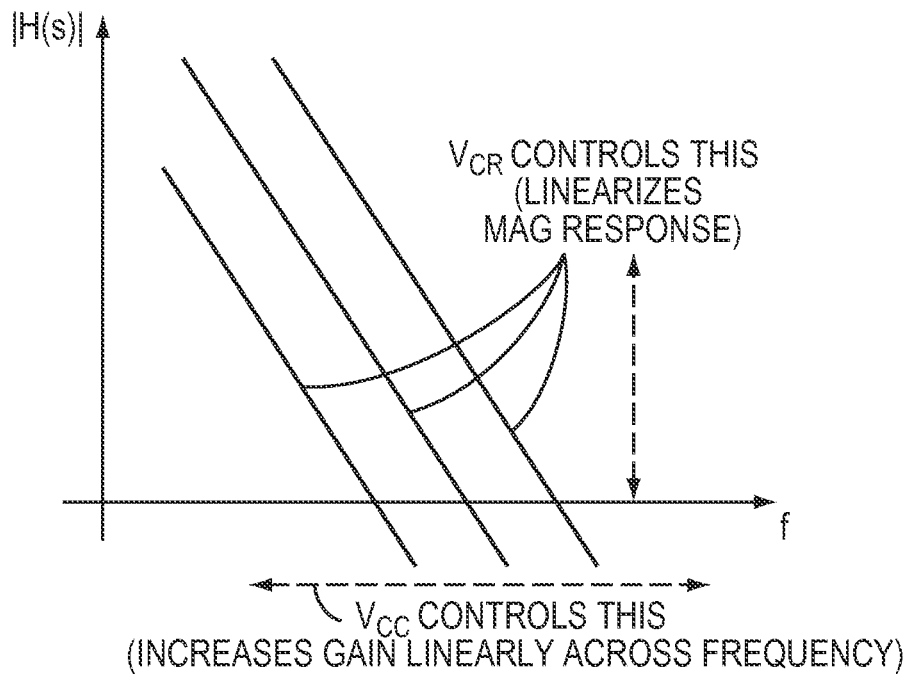
FIGS. 12A-B are graphs illustrating a result of controlling an integrator.
Figure 12B:
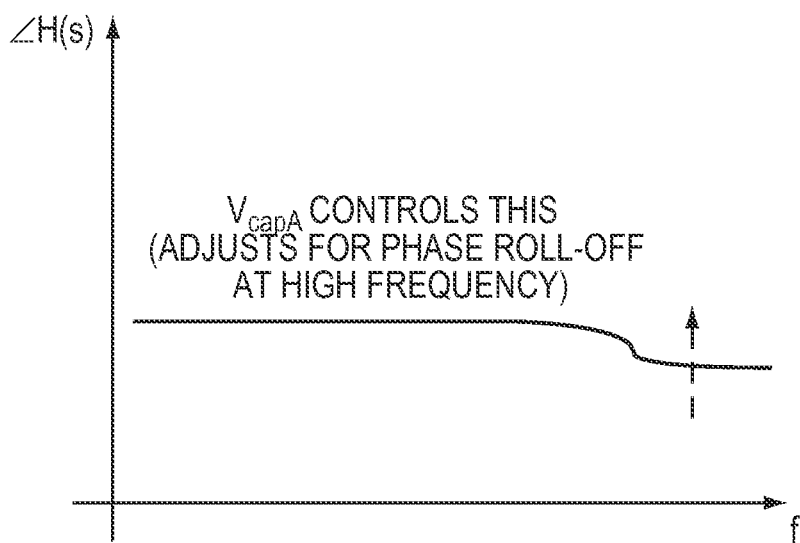

FIGS. 12A-B are grans illustrating integrator control and corresponding output. In an example 8th order bandpass filter described above, VCR1, VCR2, VCapA, Vi1_sw, Vi2_sw, VCC1, VCC2 are the primary pins involved in integrator phase and gain tuning VCR1, VCR2, and potentially VCapA (its inclusion depends on operating frequency) are set first to tune the phase response to −89° target phase shift. Vi1_sw, Vi2_sw, VCC1, and VCC2 are set second to tune the gain to the target value. Their associated bits control the phase and gain values.

Figure 13:
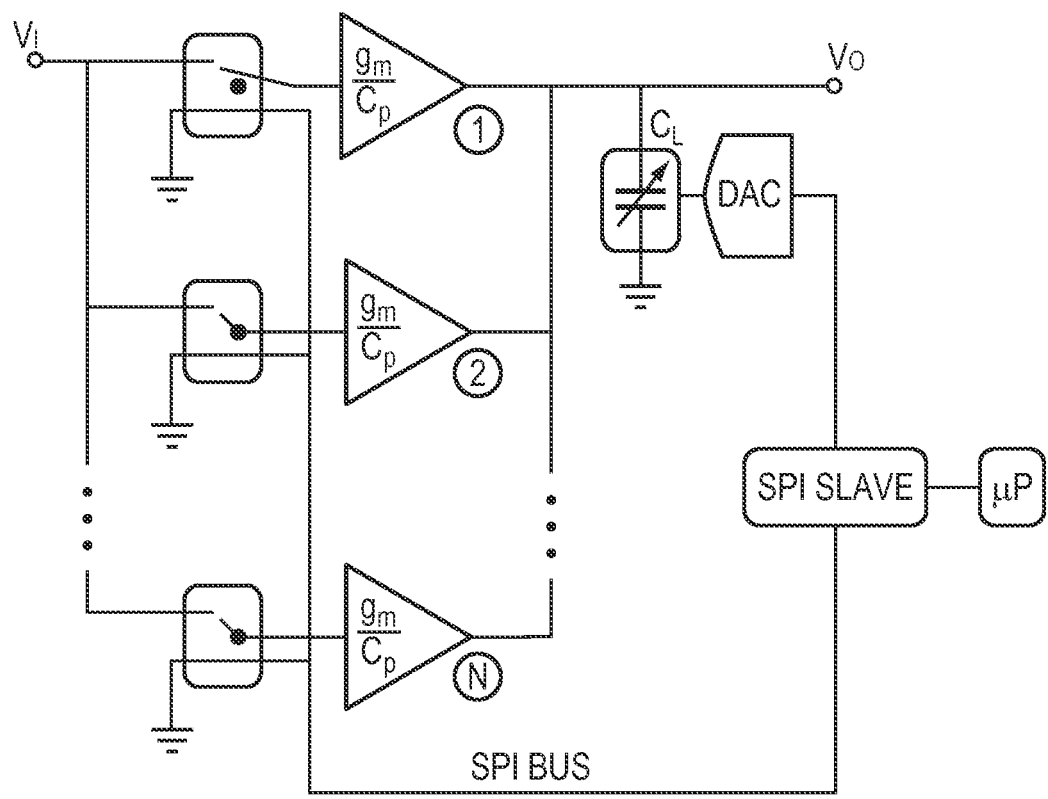
FIG. 13 is a circuit diagram of a circuit for tuning integrator gain.
Figure 14A:
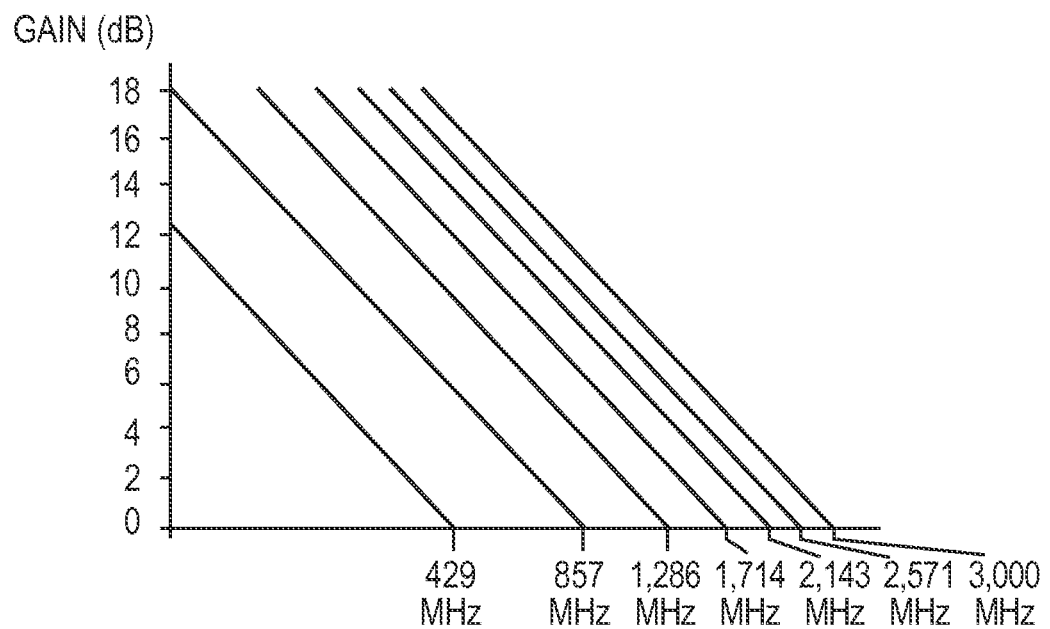
FIGS. 14A-B are charts illustrating an example coarse tuning of an integrator.
Figure 14B:
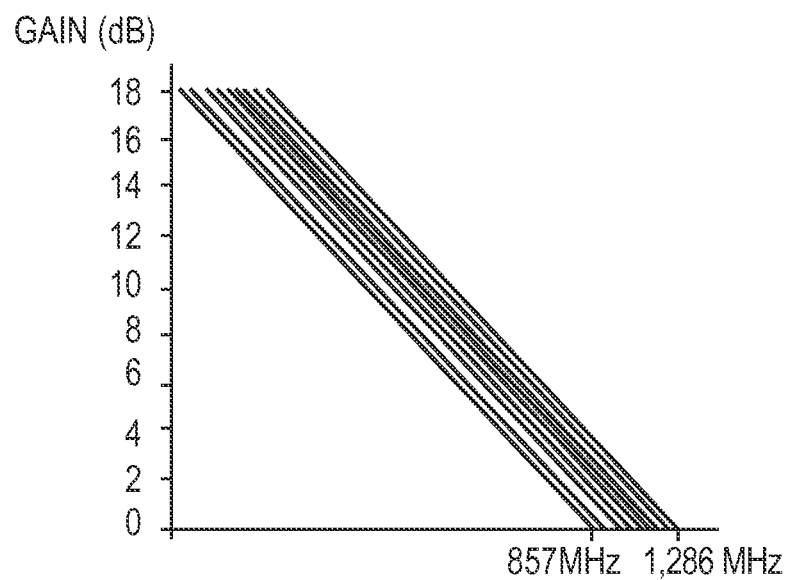

FIG. 13 is a circuit diagram of a circuit for tuning integrator gain. With reference to FIG. 5B, inputs Vi1_sw/Vi2_sw connect to switches at left to control coarse gain tuning, and inputs VCC1/VCC2 control fine gain tuning through CL. A chart illustrating example course tuning values is shown in FIGS. 14A-B.

With reference to FIG. 5B, assignment of inputs to control the loss pad, as well as phase and gain of the integrators, may be as follows:

1) Pins VCR1 and VCR2 control phase adjustment of Integrators 1 and 2. Their 12 associated bits control the phase value.

2) Pin VCapA controls fine phase adjustment of Integrators 1 and 2, if required. Its 12 associated bits control the phase value. Its use is dependent on the operating frequency range and is only required for frequencies of operation that exceed a given threshold (for example, 1.5 GHz).

3) Switches Vi1_SW and Vi2_SW control coarse gain adjustment of Integrators 1 and 2, respectively (7 steps of coarse tunability, using lookup from a priori information). Their 3 associated bits control which value from the lookup table to use.

4) Pins VCC1 and VCC2 control fine gain adjustment of Integrators 1 and 2. Their 12 associated bits control the gain value. They are typically set to≈900 mV.

5) Vca_1 controls attenuation adjustment of the Loss Pad controlling a1. Its 12 associated bits control the loss value.

Biquad as Notch Filter

Figure 15A:
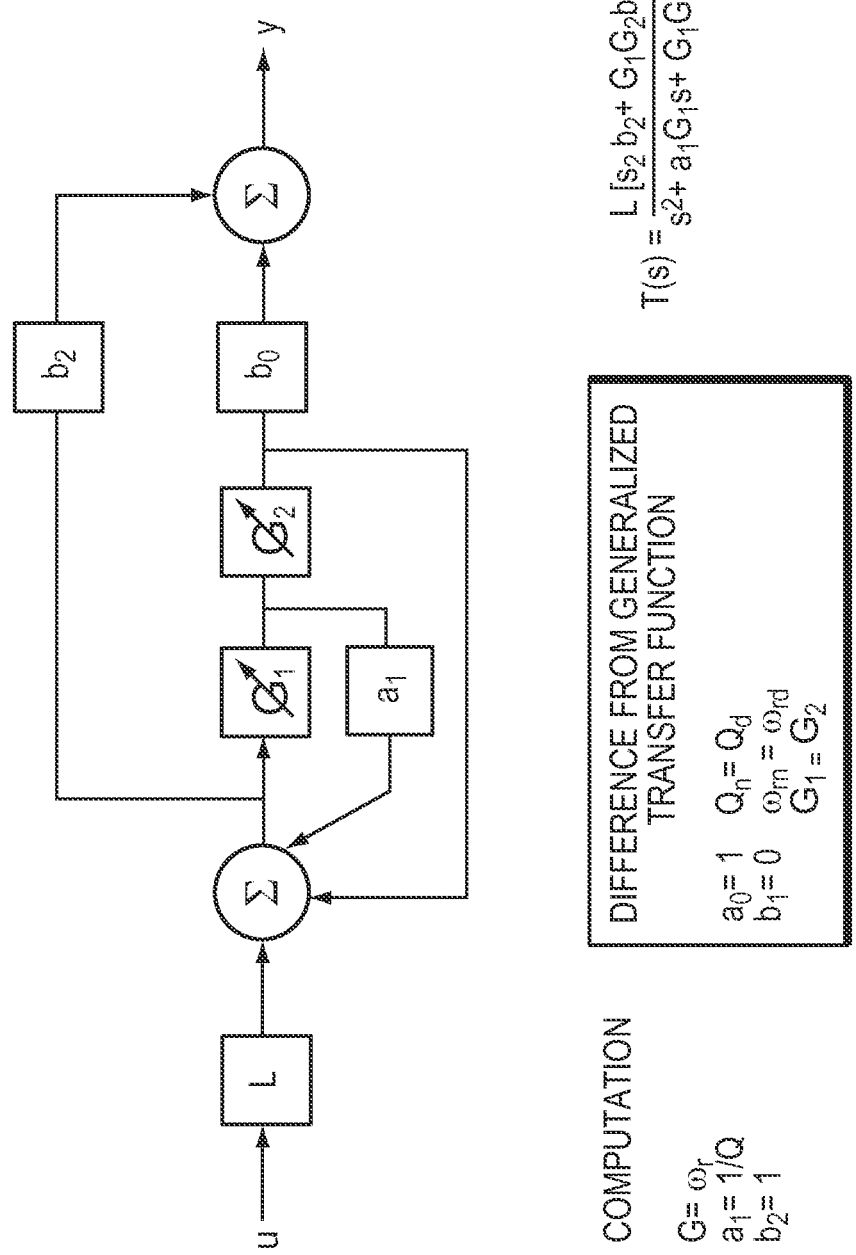
FIGS. 15A-B are circuit and flow diagrams illustrating an example tuning of a state variable filter for operation as a notch filter.
Figure 15B:
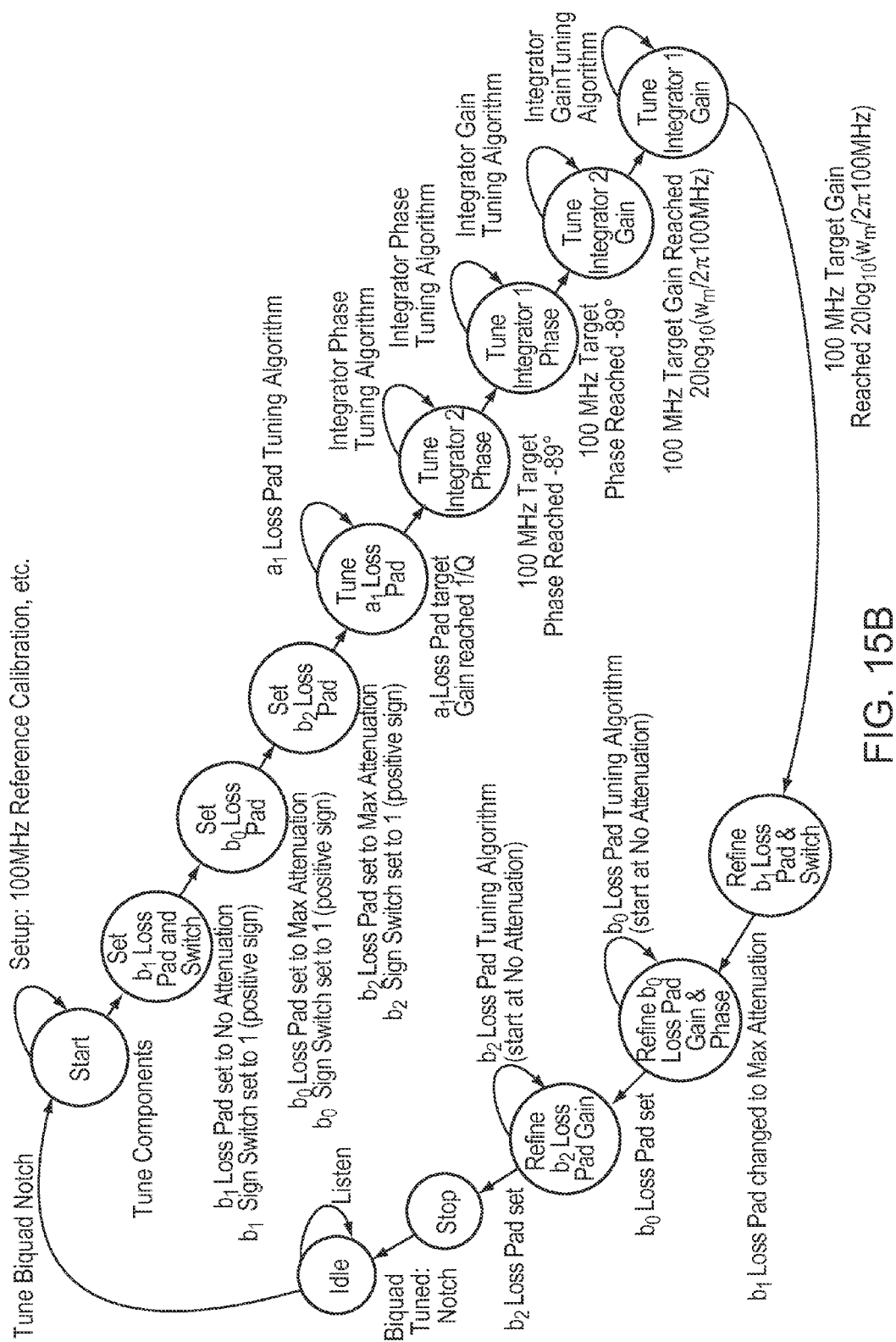

FIGS. 15A-B are circuit and flow diagrams illustrating an example tuning of a state variable filter for operation as a notch filter. FIG. 15A illustrates a computation of a transfer function to be realized via the tuning procedure. The state diagram of FIG. 15B follows an empirically-determined procedure to tune the state variable filter for operation as a notch filter. After building a bandpass filter as through the state machine of FIG. 6, 'b' coefficients are adjusted. The b1 loss pad is changed to "Max Attenuation" while b0 and b2 are adjusted from maximum attenuation to "No Attenuation". If these adjustments fail to create the desired notch filer, further refinement of the b0 loss pad gain and phase and b2 loss pad gain can be performed.

Biquad as all-Pass Filter (Delay Line)

Figure 16A:
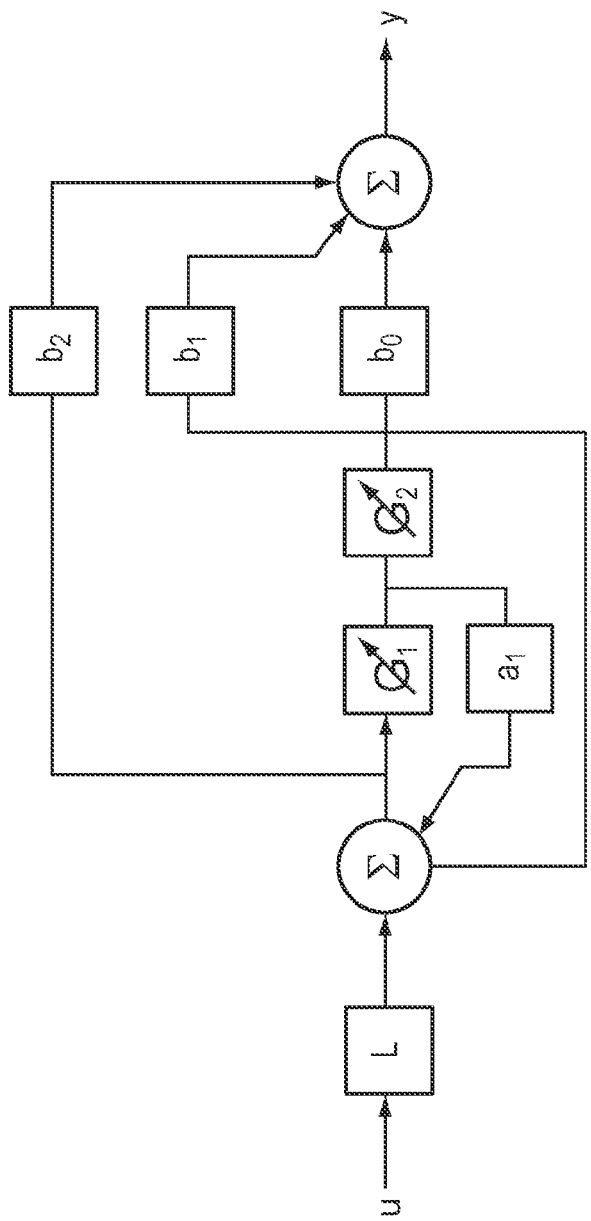
FIG. 16A-B are circuit and flow diagrams illustrating an example tuning of a state variable filter for operation as an all-pass (delay) filter.
Figure 16B:
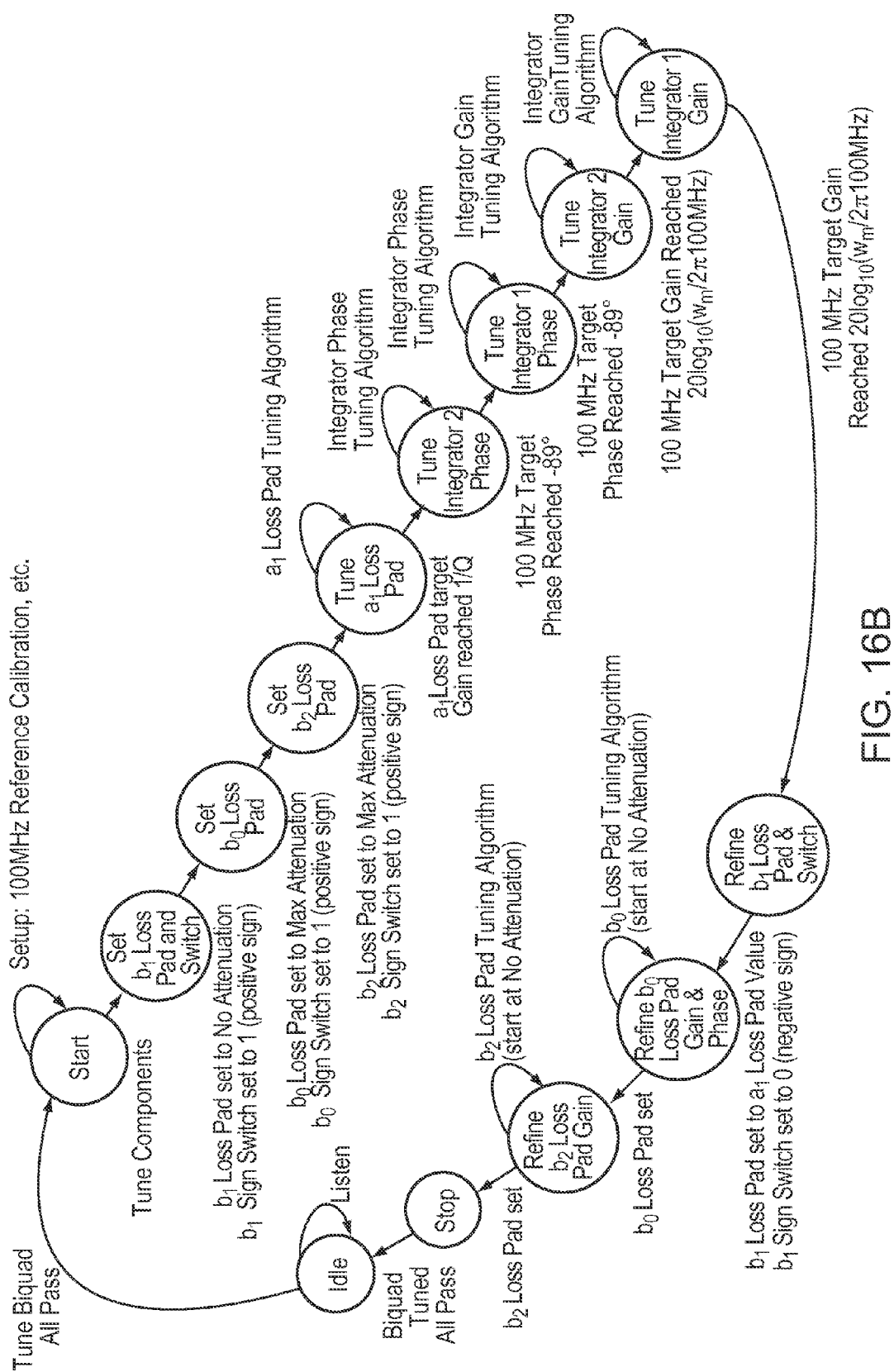

FIG. 16A-B are circuit and state diagrams illustrating an example tuning of a state variable filter for operation as an all-pass (delay) filter. FIG. 16A illustrates a computation of a transfer function to be realized via the tuning procedure. The state diagram of FIG. 16B follows an empirically-determined procedure to tune the state variable filter for operation as an all-pass (delay) filter. After building a bandpass filter as in the state machine of FIG. 6, 'b' coefficients are adjusted. The b1 loss pad is set to the a1 loss pad value and the b1 switch goes from positive to negative. Additionally, the b0 and b2 loss pads are adjusted from maximum attenuation to "no attenuation." If these changes do not create the desired all-pass filter, further refinement of the b0 loss pad gain and phase and b2 loss pad gain can be performed.

While this invention has been particularly shown and described with references to example embodiments thereof, it will be understood by those skilled in the art that various changes in form and details may be made therein without departing from the scope of the invention encompassed by the appended claims.

What is claimed is:

1. A method of tuning a filter of a biquad circuit, the biquad circuit comprising analog circuit components including a loss pad, a first integrator, and a second integrator, the method comprising:

tuning the loss pad to generate a target gain value at a predetermined frequency;

tuning a phase of the first integrator to a target phase at the predetermined frequency;

tuning a phase of the second integrator to the target phase at the predetermined frequency; and tuning a gain of the first integrator to the target gain value at the predetermined frequency; and tuning a gain of the second integrator to the target gain value at the predetermined frequency;

wherein each tuning step comprises changing circuit values.

2. The method of claim 1, further comprising determining the target gain value at the predetermined frequency.

3. The method of claim 1, wherein tuning the loss pad includes adjusting an attenuation value at the loss pad.

4. The method of claim 1, wherein tuning the phase of the first integrator includes adjusting a phase value of an input at the first integrator, the phase value controlling the phase of the first integrator.

5. The method of claim 1, wherein tuning the gain of the first integrator includes adjusting a coarse gain value and adjusting a fine gain value at the first integrator, the coarse gain value and fine gain value controlling the gain of the first integrator.

6. The method of claim 1, wherein tuning the phase of the second integrator includes adjusting a phase value of an input at the second integrator, the phase value controlling the phase of the second integrator.

7. The method of claim 1, wherein tuning the gain of the second integrator includes adjusting a coarse gain value and adjusting a fine gain value at the second integrator, the course gain value and fine gain value controlling the gain of the second integrator.

8. The method of claim 1, wherein the biquad circuit is tuned to operate as a notch filter.

9. The method of claim 1, wherein the biquad circuit is tuned to operate as an all-pass filter.

* * * * *